United States Patent
Roberts et al.

(10) Patent No.: US 11,239,276 B2
(45) Date of Patent: Feb. 1, 2022

(54) CMOS COLOR IMAGE SENSORS WITH METAMATERIAL COLOR SPLITTING

(71) Applicant: CALIFORNIA INSTITUTE OF TECHNOLOGY, Pasadena, CA (US)

(72) Inventors: Gregory Roberts, Pasadena, CA (US); Philip Camayd-Munoz, Pasadena, CA (US); Conner Ballew, Pasadena, CA (US); Andrei Faraon, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 285 days.

(21) Appl. No.: 16/657,640

(22) Filed: Oct. 18, 2019

(65) Prior Publication Data
US 2021/0118938 A1    Apr. 22, 2021

(51) Int. Cl.
*H01L 27/146*    (2006.01)
*H01L 31/0232*    (2014.01)
(Continued)

(52) U.S. Cl.
CPC ...... *H01L 27/14689* (2013.01); *G02B 5/0247* (2013.01); *G02B 27/0944* (2013.01); *H01L 27/14605* (2013.01); *H01L 27/14607* (2013.01); *H01L 27/14621* (2013.01); *H01L 27/14647* (2013.01); *H01L 27/14685* (2013.01);
(Continued)

(58) Field of Classification Search
CPC ............ G02B 27/0012; G02B 27/0025; G02B 27/0037; G02B 27/0056; G02B 27/0916; G02B 27/0938; G02B 27/0944; G02B 27/0977; G02B 27/4205; G02B 5/0236; G02B 5/0247; H01L 27/14689; H01L 27/14621; H01L 27/14685; H01L 27/14625; H01L 31/0232
See application file for complete search history.

(56) References Cited

U.S. PATENT DOCUMENTS 3,971,065 A    7/1976    Bayer
5,438,414 A    8/1995    Rust
(Continued)

FOREIGN PATENT DOCUMENTS

CN    107076884 A    8/2017
CN    107076884 B    3/2020
(Continued)

OTHER PUBLICATIONS

Fifi S., et al., "Electromagnetic Scattering From 3D Layered Structures With Randomly Rough Interfaces: Analysis With the Small Perturbation Method and the Small Slope Approximatio,". IEEE Transactions on Antennas and Propagation [online], Jul. 2014 [Retrieved on Jul. 20, 2020], Retrieved from https://ieeexplore.ieee.org/abstract/document/6862023.
(Continued)

*Primary Examiner* — David A Zarneke
(74) *Attorney, Agent, or Firm* — Steinfl + Bruno, LLP

(57) ABSTRACT

Methods to build multi-functional scattering structures while respecting tight requirements imposed by manufacturing processes are described. The described methods and devices are based on etching away wire networks embedded in 3D structures to form voids in order to perform a target function. Optimization algorithms for designing binarized devices that meet manufacturing requirements are also disclosed.

13 Claims, 17 Drawing Sheets

(51) Int. Cl.
  *G02B 27/09* (2006.01)
  *G02B 5/02* (2006.01)
  *G02B 27/00* (2006.01)
  *G02B 27/42* (2006.01)
(52) U.S. Cl.
  CPC ........ *H01L 31/0232* (2013.01); *G02B 5/0236* (2013.01); *G02B 27/0012* (2013.01); *G02B 27/0025* (2013.01); *G02B 27/0037* (2013.01); *G02B 27/0056* (2013.01); *G02B 27/0916* (2013.01); *G02B 27/0938* (2013.01); *G02B 27/0977* (2013.01); *G02B 27/4205* (2013.01); *H01L 27/14625* (2013.01)

(56) References Cited

U.S. PATENT DOCUMENTS

| | | |
|---|---|---|
| 7,408,712 B2 | 8/2008 | Ruoff et al. |
| 9,254,089 B2 | 2/2016 | Tearney et al. |
| 9,739,918 B2 | 8/2017 | Arbabi et al. |
| 2002/0057431 A1 | 5/2002 | Fateley et al. |
| 2003/0028114 A1 | 2/2003 | Casscells, III et al. |
| 2003/0082105 A1 | 5/2003 | Fischman et al. |
| 2003/0210396 A1 | 11/2003 | Hobbs et al. |
| 2004/0184006 A1 | 9/2004 | Okuyama et al. |
| 2006/0057707 A1 | 3/2006 | Cunningham et al. |
| 2007/0019306 A1 | 1/2007 | Wu et al. |
| 2007/0229955 A1 | 10/2007 | Kawamura et al. |
| 2007/0233396 A1 | 10/2007 | Tearney et al. |
| 2008/0013960 A1 | 1/2008 | Tearney et al. |
| 2008/0161194 A1 | 7/2008 | Turner et al. |
| 2009/0250110 A1 | 10/2009 | Yu et al. |
| 2010/0107693 A1 | 5/2010 | Rajala et al. |
| 2010/0302481 A1 | 12/2010 | Baum et al. |
| 2012/0013989 A1 | 1/2012 | Choi et al. |
| 2012/0082863 A1 | 4/2012 | Ohta et al. |
| 2012/0092770 A1 | 4/2012 | Li et al. |
| 2012/0194912 A1 | 8/2012 | Faraon et al. |
| 2014/0146390 A1 | 5/2014 | Kaempfe et al. |
| 2014/0226190 A1 | 8/2014 | Bridges et al. |
| 2015/0198812 A1 | 7/2015 | Gaylord et al. |
| 2016/0025914 A1 | 1/2016 | Brongersma et al. |
| 2016/0077261 A1 | 3/2016 | Arbabi et al. |
| 2016/0109381 A1 | 4/2016 | Pavani |
| 2019/0173191 A1 | 6/2019 | Kamali et al. |
| 2019/0191144 A1 | 6/2019 | Arbabi et al. |
| 2020/0124866 A1 | 4/2020 | Camayd-Munoz et al. |

FOREIGN PATENT DOCUMENTS

| | | |
|---|---|---|
| CN | 113167938 A | 7/2021 |
| EP | 3195048 A1 | 7/2017 |
| EP | 3871020 A2 | 9/2021 |
| JP | 2004233910 A | 8/2004 |
| JP | 2012078541 A | 4/2012 |
| JP | 2017527857 A | 9/2017 |
| KR | 20210064240 A | 6/2021 |
| TW | 201140141 A | 11/2011 |
| WO | 2016/044104 A1 | 3/2016 |
| WO | 2020/146029 A2 | 7/2020 |
| WO | 2021/076154 A1 | 4/2021 |

OTHER PUBLICATIONS

International Search Report and Written Opinion for International Application No. PCT/US2019/057026 filed on Oct. 18, 2019 on behalf of California Institute of Technology dated Aug. 10, 2020 12 pages.
International Search Report and Written Opinion for PCT App. No. PCT/US2019/056809 filed on Oct. 17, 2019 on behalf of California Institute of Technology, dated Jul. 31, 2020. 13 Pages.
A.Y. Piggot et al., "Inverse design and demonstration of a compact and broadband on-chip wavelength demimultiplexer" Nat. Photonics 9, 374-377 (2015).
Q. Chen et al., "Nanophotonic Image Sensors" Small 12, 4922-4935 (2016). 14 pages.
Aieta, F et al., "Aberration-free ultrathin flat lenses and axicons attelecom wavelengths based on plasmonic metasurfaces,"*Nano Lett*. 12, 4932-4936. Aug. 15, 2012. 5 Pages.
Aieta, F. et al., "Multiwavelength achromatic metasurfaces by dispersive phase compensation," *Science*347, 1342-1345. Mar. 20, 2015. 4 Pages.
Allowance for Chinese Application No. 201580049474.8 filed on Mar. 14, 2017 on behalf of California Institute of Technology. dated Dec. 31, 2019. Chinese + English Trans. 3 Pages.
Andreou, A. G., et al., "Polarization Imaging: Principles and Integrated Polarimeters," *IEEE Sensors Journal*, vol. 2, No. 6, Dec. 2002. pp. 566-576. 11 Pages.
Appeal Decision of Refusal issued for JP Patent Application No. 2017-513414 filed on Sep. 11, 2015, on behalf of California Institute of Technology. dated Jul. 13, 2021. Japanese Original and Eng Transl. 42 Pages.
Arbabi, A., et al., "Conference Presentation: Increasing Efficiency of high-NA Metasurface Lenses,"*Proc. Of SPIE* vol. 10113. Apr. 28, 2017. Abstract Only. 1 Page. Watch Online at https://www.spiedigitallibrary.org/conference-proceedings-of-spie/10113/101130K/lncreasing-efficiency-of-high-NA-metasurface-lenses-Conference-Presentation/10.1117/12.2250391.short.
Arbabi, A et al., "Controlling the phase front of optical fiber beams using high contrast Metastructures," *OSA Technical Digest*, STu3M.4 Optical Society of America, Jan. 2014. 2 Pages.
Arbabi, A., et al., "Dielectric metasurfaces for complete control of phase and polarization with subwavelength spatial resolution and high transmission," *Nature Nanotechnology*, published online on Aug. 31, 2015. 8 Pages.
Arbabi, A et al., "Fundamental limits of ultrathin metasurfaces," Preprint at http://arXiv.org/abs/1411.2537. Nov. 10, 2014. 6 Pages.
Arbabi, A., et al., "Miniature optical planar camera based on a wide-angle metasurface doublet corrected for monochromatic aberrations," *Nature Communications*, 7:13682. Published Nov. 28, 2016. 9 Pages.
Arbabi, A., et al., "Planar Metasurface Retroreflector," *Nature Photonics*, Advance Online Publication. Published Online Jun. 19, 2017. 7 Pages.
Arbabi, A., et al., "Subwavelength-thick lenses with high numerical apertures and large efficiency based on high-contrast transmit arrays,"*Nature Communications*. 6:7069. May 7, 2015. 9 Pages.
Arbabi, E., et al., "Controlling the sign of chromatic dispersion in diffractive optics with dielectric metasurfaces," *Optica*, vol. 4, No. 6. Jun. 2017. 8 Pages.
Arbabi, E., et al., "Full-Stokes Imaging Polarimetry Using Dielectric Metasurfaces," *ACS Photonics*2018, 5, 3132-3140. Mar. 21, 2018. 9 Pages.
Arbabi, E., et al., "MEMS-tunable dielectric metasurface lens," *Nature Communications*, 9:812. Feb. 23, 2018. 9 Pages.
Arbabi, E., et al., "Multiwavelength metasurfaces through spatial multiplexing," *Scientific Reports*, 6:32803. Sep. 6, 2016. 8 Pages.
Arbabi, E., et al., "Multiwavelength polarization-insensitive lenses based on dielectric metasurfaces with meta-molecules," *Optica*, vol. 3, No. 6. Jun. 10, 2016. pp. 628-633. 6 Pages.
Arbabi et al., "Dielectric metasurfaces for complete control of phase and polarization with subwavelength spatial resolution and high transmission,"+Supplementary Information. *Nature Nanotechnology*doi: 10.1038/nnano.2015.186/. Nov. 2015. 17 Pages.
Astilean, S., et al., "High-efficiency subwavelength diffractive element patterned in a high-refractive-index material for 633 nm," *Optics Letters*, vol. 23, No. 7, Apr. 1, 1998. pp. 552-554. 3 Pages.
Balthasar Mueller, J. P., et al., "Ultracompact metasurface in-line polarimeter," *Optica*, vol. 3, No. 1. Jan. 2016. pp. 42-47. 6 Pages.
Camayd-Muñoz, P., et al., "Multifunctional volumetric meta-optics for color and polarization image sensors," *Optica*, 7(4), pp. 280-283. Apr. 2020. 4 Pages.
Camayd-Muñoz, P., et al., Supplementary material for "Multifunctional volumetric meta-optics for color and polarization image sensors," *Optica*, vol. 7 No. 4, Mar. 31, 2020. 5 Pages.

(56) References Cited

OTHER PUBLICATIONS

Charanya, T., et al., "Trimodal color-fluorescence-polarization endoscopy aided by a tumor selective molecular probe accurately detects flat lesions in colitis-associated cancer," *J. Biomed. Opt.*19(12) 126002, Dec. 2014, 15 pages.

Chen, W. T., et al., "Integrated Plasmonic Metasurfaces for Spectropolarimetry," *Nanotechnology*27, 224002. Apr. 26, 2016. 8 Pages.

Chihhui, Wu., et al., "Spectrally selective chiral silicon metasurfaces based on infrared Fano resonances", *Nature Communications*, vol. 5, May 27, 2014, XP055465835, DOI: 10.1038/ncomms4892. 9 Pages.

Coffeen, D.L., et al., "Polarization and scattering characteristics in the atmospheres of Earth, Venus, and Jupiter," *J. Opt. Soc. Am.*, vol. 69, No. 8, Aug. 1979. pp. 1051-1064. 14 Pages.

Communication under Rule 71(3) issued for EP Patent application 15842895.3 filed on Mar. 8, 2017, on behalf of California Institute of Technology. dated May 25, 2021. 5 Pages.

Decision of Refusal for JP Patent Application No. 2017-513414 filed on Sep. 11, 2015 on behalf of behalf of California Institute of Technology. dated May 12, 2020. Japanese + English Trans. 19 Pages.

Decker, M., et al., "High-efficiency dielectric Huygens' surfaces," *Adv. Opt. Mater.*3, 813-820. Feb. 1, 2015. 8 Pages.

Deguzman, P. C., et al., "Stacked subwavelength gratings as circular polarization filters," *Applied Optics*, vol. 40, No. 31. Nov. 2001. pp. 5731-5737. 7 Pages.

Ding, F., et al. "Beam-Size-Invariant Spectropolarimeters Using Gap-Plasmon Metasurfaces," *ACS Photonics*, 943-49. Published Feb. 28, 2017. 7 pages.

Dottermusch, S., et al., "Exposure-dependent refractive index of Nanoscribe IP-Dip photoresist layers," *Optics letters*, 44, vol. 1, Jan. 1, 2019. pp. 29-32. 4 Pages.

Egan, W. G., "Terrestrial polarization imagery obtained from the Space Shuttle: characterization and interpretation," *Applied Optics*, vol. 30, No. 4. Feb. 1991. pp. 435-441. 8 pages.

Ellenbogen, T., et al., "Chromatic Plasmonic Polarizers for Active Visible Color Filtering and Polarimetry," *ACS Publications*, Nano Lett. 2012, 12. Jan. 9, 2012, 1026-1031. 6 Pages.

Evlyukhin, A. B., et al., "Multipole lightscattering by nonspherical nanoparticles in the discrete dipole approximation," *Phys. Rev.*B 84, 235429. Dec. 20, 2011. 8 pages.

Fattal, D., et al., "Flat dielectric grating reflectors with focusing abilities," *Nature Phonics*, vol. 4. Jul. 2010. pp. 466-470. 5 Pages.

First Chinese Office Action for Chinese Application No. 201580049474.8 filed on Mar. 14, 2017 on behalf of California Institute of Technology. dated Dec. 19, 2018. 16 Pages. English + Chinese.

Flanders, D.C., "Submicrometer periodicity gratings as artificial anisotropic dielectrics," *Applied Physics Letters*, 42: p. 492-4. Mar. 15, 1983. 4 Pages.

García-Etxarri, A. et al., "Strong magnetic response of submicron silicon particles in the Infrared "*Opt. Express*, 4815-4826. Feb. 28, 2011. 12 Pages.

Garcia, M., et al., "Bio-inspired color-polarization imager for real-time in situ imaging," *Optica*, vol. 4, No. 10. Oct. 2017. pp. 1263-1271. 9 Pages.

Garcia, N. M., "Surface Normal reconstruction using circularly polarized light," *Optics Express*, vol. 23, No. 11. Jun. 1, 2015. pp. 14391-14406. 16 Pages.

Gissibl, T., et al., "Refractive index measurements of photo-resists for three-dimensional direct laser writing," *Optical Materials Express*, 7(7), 2293-2298. Jul. 1, 2017. 6 Pages.

Groever, B., et al., "Meta-lens doublet in the visible region," Nano Lett. 17, 4902-4907, Jun. 29, 2017. 6 Pages.

Gruev, V., et al., "CCD polarization imaging sensor with aluminum nanowire optical filters," *Optics Express*, vol. 18, No. 18. Aug. 2010. pp. 19087-19094. 8 Pages.

Gruev, V., et al., "Fabrication of a dual-tier thin film micropolarization array," *Optics Express*, vol. 15, No. 8. Apr. 16, 2007. pp. 4994-5007. 14 Pages.

Gruev, V., et al., "Image Sensor With Focal Plane Extraction of Polarimetric Information" *IEEE, ISCAS.*Jan. 2006. pp. 213- 216. 4 Pages.

Guo, J., et al., "Fabrication of thin-film micropolarizer arrays for visible imaging polarimetry," *Applied Optics*, vol. 39, No. 10. Apr. 1, 2000. pp. 1486-1492. 7 Pages.

Hong, L., et al., "Integrated Angle-Insensitive Nanoplasmonic Filters for Ultraminiaturized Fluorescence Microarray in a 65 nm Digital CMOS Process," ACS Photonics, 5, Sep. 12, 2018. pp. 4312-4322. 11 Pages.

Hsiao, H-H., et al., "Fundamentals and Applications of Metasurfaces, " *Small Methods*, Mar. 24, 2017. 20 Pages.

International Search Report and Written Opinion for PCT/US2015/049837 filed Sep. 11, 2015 on behalf of California Institute of Technology. dated Jan. 11, 2016. 13 pages.

Khorasaninejad, M., et al., "Efficient Polarization Beam Splitter Pixels Based on A Dielectric Metasurface," *Optica*, vol. 2, No. 4. Apr. 15, 2015. 7 Pages.

Khorasaninejad, M., et al., "Metalenses at visible wavelengths: Diffraction-limited focusing and subwavelength resolution imaging," *Science*, vol. 352 Issue 6290, Jun. 3, 2016. pp. 1190-1194. 6 Pages.

Kikuta, H et al., "Achromaticquarter-wave plates using the dispersion of form Birefringence," *Appl. Opt.*36, 1566-1572. Mar. 1, 1997. 7 Pages.

Kildishev, A. V. et al., "Planar photonics with metasurfaces," *Science*339, 1232009, Mar. 15, 2015. 8 Pages.

Klemm, A. B. et al., "Experimental high numerical aperture focusing with high contrast gratings," *Opt. Lett.*38, 3410-3413. Aug. 28, 2013. 4 Pages.

Komar, A., et al., "Electrically tunable all-dielectric optical metasurfaces based on liquid crystals," Appl. Phys. Lett. 110, Jul. 11, 2009; doi: 10.1063/1.4976504. Feb. 15, 2017. 5 Pages.

Kozawa, Y. et al., "Generation of a radially polarized laser beam by use of a conical Brewster prism," *Opt. Lett.*30, 3063. Nov. 15, 2005. 3 Pages.

Kuznetsov, A. I., et al., "Optically resonant dielectric nanostructures," *Science*, vol. 354 Issue 6314., Nov. 18, 2016. 10 Pages.

Lalanne, P., "Blazed binary subwavelength gratings with efficiencies larger than those of conventional 'echelette gratings," *Optics Letters*, vol. 23, No. 14. Jul. 15, 1998. 1081-1083. 3 Pages.

Lalanne, P et al., "Design and fabrication of blazed binary diffractive elements with 20 sampling periods smaller than the structural cutoff," *J. Opt. Soc. Am.*A, 1143-1156. May 1999. 14 Pages.

Lin, D et al., "Dielectric gradient metasurface optical elements," *Science*345, 298-302. Jul. 18, 2014. 6 Pages.

Lin, D., et al., "Dielectric gradient metasurface optical elements," *Science*, U.S.A., vol. 345, p. 298-302. Jul. 18, 2014. 6 Pages.

Lin, D., et al., "Photonic Multitasking Interleaved Si Nanoantenna Phased Array," *Nano Lett.*, 16. Nov. 18, 2016. pp. 7671-7676. 6 Pages.

Lin, J. et al., "Nanostructured holograms for broadband manipulation of vector beams," *Nano Lett.*13, 4269-4274. Aug. 5, 2013. 6 Pages.

Liu, V., et al., "S4: a free electromagnetic solver for layered periodic structures," *Comput. Phys. Commun.* 183, 2233-2244. Available online May 19, 2012. 12 Pages.

Liu, Y., et al., "Complementary fluorescence-polarization microscopy using division-of-focal-plane polarization imaging sensor," *Journal of Biomedical Optics*, 17 (11). Nov. 2012. 116001-1-116001-4. 5 Pages.

Lu, F., et al., "Planar high-numerical-aperture low-loss focusing reflectors and lenses using subwavelength high contrast gratings," Optics Express, vol. 18, No. 12. Jun. 7, 2010. pp. 12606-12614. 9 Pages.

Monticone, F., et al., "Full control of nanoscale optical transmission with a composite metascreen," *Phys. Rev. Lett.*110, 203903. May 17, 2013. 5 Pages.

(56) References Cited

OTHER PUBLICATIONS

Mutlu, M., et al., "Experimental realization of a high-contrastgrating based broadband quarter-wave plate," *Optics express*, 20: p. 27966-73. Nov. 30, 2012. 8 Pages.

Non-Final Office Action for U.S. Appl. No. 14/852,450, filed Sep. 11, 2015 on behalf of California Institute of Technology. dated Dec. 12, 2016. 11 Pages.

Non-Final Office Action for U.S. Appl. No. 16/656,156, filed Oct. 17, 2019, on behalf of California Institute of Technology. dated Jul. 27, 2021. 13 pages.

Nordin, G. P., et al., "Diffractive Optical Elements for Strokes Vector Measurement with a Focal Plane Array," *Proceedings of SPIE*, vol. 3754. Part of the Conference on Polarization. Jul. 1999. 10 Pages.

Nordin, G. P., et al., "Micropolarizer array for infrared imaging polarimetry," *J. Opt. Soc. Am. A.*, vol. 16, No. 5. May 1999. pp. 1168-1174. 7 Pages.

Notice of Allowance for U.S. Appl. No. 14/852,450, filed Sep. 11, 2015 on behalf of California Institute of Technology. dated Apr. 25, 2017. 11 Pages.

Notification for Reason of Refusal for JP Patent application JP2017-513414 filed on Sep. 11, 2015 on behalf of California Institute of Technology. dated Aug. 15, 2019. Japanese + English Trans. 17 Pages.

Paniagua-Dominguez, R et al., "A Metalens With Near-Unity Numerical Aperture," *Nano Letters*, Published online on Feb. 27, 2018. 32 Pages.

Pezzaniti, J. L., et al., "Mueller matrix imaging polarimetry," *Optical Engineering*, vol. 34 No. 6. Jun. 1995. pp. 1558-1568. 11 Pages.

Pfeiffer, C et al., "Cascaded metasurfaces for complete phase and polarization control," *Appl. Phys. Lett.* 102, 231116. Published online Jun. 11, 2013. 5 pages.

Phelan, C. F. et al., "Generation of a radially polarized light beam using internal conical Diffraction," *Opt. Express*, 21793-21802, Oct. 20, 2011. 10 Pages.

Restriction Requirement for U.S. Appl. No. 16/656,156, filed Oct. 17, 2019 on behalf of California Institute of Technology dated Mar. 2, 2021 6 pages.

Roberts, N. W., et al., "Animal Polarization Imaging and Implications for Optical Processing," *Proceedings of the IEEE*, vol. 102 No. 10. Oct. 2014. pp. 1427-1434. 8 Pages.

Rubin, N. A., et al., "Matrix Fourier optics enables a compact full-Stokes polarization camera," *Science*, 365(6448), eaax1839. Jul. 5, 2019. 10 Pages.

Schonbrun, E. et al., "Reconfigurable imaging systems using elliptical nanowires," *Nano Lett.* 11, 4299-4303. Sep. 16, 2011. 5 Pages.

Second Chinese Office Action for Chinese Application No. 201580049474.8 filed on Mar. 14, 2017 on behalf of California Institute of Technology. dated Aug. 2, 2019. Chinese + English Trans. 11 Pages.

Sell, D., et al., "Large-Angle, Multifunctional Metagratings Based on Freeform Multimode Geometries," *Nano Letters.* 17, 3752-3757. 2017. 6 Pages.

Solomon, J. E., et al., "Polarization imaging," *Applied Optics*, vol. 20, No. 9. May 1, 1981. pp. 1537-1544. 8 Pages.

Spinelli, P., et al., "Broadband omnidirectional antireflection coating based on subwavelength surface Mie resonators," *Nature Commun.* 3, 692. Feb. 21, 2012. 5 Pages.

Staude, I., et al., "Metamaterial-inspired silicon nanophotonics," *Nature Photonics*, vol. 11. May 2017. pp. 274-284. Pgs. 11 Pages.

Supplementary Search Report and Opinion for EP Patent application 15842895.3 filed on Mar. 8, 2017, on behalf of California Institute Oftechnology. dated May 15, 2018. 6 pages.

Swanson, G. J., "Binary optics technology: the theory and design of multi-level diffractive optical elements," *Technical Report 845. Massachusetts Institute of Technology*, DTIC, Aug. 14, 1989. 53 Pages.

Tyo, J.S., et al., "Review of passive imaging polarimetry for remote sensing applications," *Applied Optics*, vol. 45, No. 22. Aug. 1, 2006. pp. 5453-5469. 17 Pages.

Vo, S., et al., "Sub-Wavelength Grating Lenses with a Twist," *IEEE Photonics Technology Letters*, vol. 26, No. 13. Jul. 1, 2014. 4 Pages.

Walraven, R., "Polarization imagery," *Optical Engineering*, vol. 20 No. 1. Jan.-Feb. 1981. 5 Pages.

Warren, M.E., et al., "High-efficiency subwavelength diffractive optical element in GaAsfor975 nm," Optics Letters, Jun. 15, 1995. 20: p. 1441-3. 3 Pages.

Wen, D., et al., "Metasurface for characterization of the polarization state of light," *Optics Express*, vol. 23, No. 8., pp. 10273-10281. Apr. 13, 2015. 10 Pages.

West, P.R. et al., "All-dielectric subwavelength metasurface focusing lens," *Opt. Express* 22, 26212. Oct. 20, 2014. 10 Pages.

Yang, Y. et al., "Dielectric meta-reflectarray for broadband linear polarization conversion and Optical vortex Generation," *Nano Lett.* 14, 1394-1399. Feb. 18, 2014. 6 Pages.

Yu, N., et al., "A broadband, background-free quarter-wave plate based on plasmonic Metasurfaces," *Nano letters*, 12: p. 6328-33. Nov. 6, 2012, 6 Pages.

Yu, N. et al., "Flat optics with designer metasurfaces," Nature Mater. 13, 139-150. Published online Jan. 23, 2014. 12 Pages.

Yu, N. et al., "Light propagation with phase discontinuities: generalized laws of reflection and refraction," *Science* 334, 333-337. Oct. 21, 2011. 6 Pages.

Zhan., A., et al., "Metasurface Freeform Nanophotonics," *Scientific Reports*, 7:1673. Published online on May 10, 2017. 9 Pages.

Zhan, Q., "Cylindrical vector beams: from mathematical concepts to applications," *Adv. Opt. Photon.* 1, 1-57. 2009. 57 Pages.

Zhao, Y. et al., "Twisted optical metamaterials for planarized ultrathin broadband circular polarizers," *Nature Commun.* 3, 870. May 29, 2012. 7 Pages.

CMOS COLOR IMAGE SENSORS WITH METAMATERIAL COLOR SPLITTING

STATEMENT OF GOVERNMENT GRANT

This invention was made with government support under Grant No. HR0011-17-2-0035 awarded by DARPA. The government has certain rights in the invention.

CROSS REFERENCE TO RELATED APPLICATIONS

The present application is related to U.S. patent application Ser. No. 16/656,156 filed on Oct. 17, 2019, titled "Color and Multi-Spectral Image Sensor Based On 3D Engineered Material", the contents of which are incorporated herein by reference in their entirety.

FIELD

The presented disclosure is related to image sensors, and more particularly to metamaterial spectrum splitters manufactured using CMOS fabrication technology.

BACKGROUND

Optical systems are typically designed via modular combinations of elements to achieve complex functions. For example, lenses and diffractive optics can be combined to perform hyperspectral imaging. This approach is intuitive and flexible, providing access to a wide range of functions from a limited set of elements. However, the overall size and weight of the optical system may limit its scope of applications. Recent advancements in nanofabrication may alleviate this constraint by replacing bulky elements with metasurfaces—planar arrays of resonant nanostructures with sub-wavelength thickness. By engineering the scattering of individual elements within the array, these devices can reproduce the multi-functionality of complex optical systems in a single element. However, efforts to combine multiple metasurfaces for more complex functionality have been stymied by reduced scattering efficiency, which scales inversely with the number of simultaneous tasks.

The inherent trade-off between multi-functionality and efficiency in these systems is due to the finite number of degrees of freedom, which scales with the volume of the device and the maximum refractive index contrast. In particular, this limits the range of independent functions achievable by any ultrathin system, such as sorting light according to frequency, polarization, and incident angle. By contrast, three-dimensional scattering elements with thicknesses greater than a wavelength commonly encode many simultaneous functions, albeit so far only with low efficiency due to weak scattering and low index-contrast.

Historically, optical design has been modular, a paradigm that provides an intuitive way to build and reconfigure optical setups. With the advancement of nanofabrication technologies it became possible to make structures with sub-wavelength feature size that enabled multi-functional optical elements combining the functionality of more complex setups. Examples include metasurface lenses that can split different polarizations and spectral bands. However, the degree of performance and functionality that can be achieved with metasurfaces and other planar structures is inherently limited by the number of optical modes that can be controlled.

Structuring the refractive index with high contrast at sub-wavelength scale provides an expansive optical design space that can be harnessed for demonstrating multi-functional optical elements. So far this has been used mostly in two dimensional structures, or metasurfaces. However, their performance is limited by the available optical degrees of freedom.

In order to highlight the benefits of the teachings of the present disclosure in the following sections, the example of image sensors is considered here. Currently, the majority of sensors record color using absorptive filters. FIG. 1A shows a prior art image sensor, wherein each four neighboring pixels has an absorptive color filter on top: two are for green, one for blue and one for red. The issue with such an image sensor is that the efficiency is limited to around 30%, as most of the light is absorbed. Color image sensors are ubiquitous in cell phones, cameras and numerous kinds of instrumentation. The color is detected by simple absorptive filters placed directly on top of each pixel. The absorptive nature of the filters means that more than ⅔ of the light is actually lost by absorption, i.e. for example red and blue light incident on the green pixel is absorbed and only green passes through

SUMMARY

Complex three-dimensional (3D) scattering structures allowing, for example, the splitting of color on the Bayer pattern with higher efficiency are disclosed in the present application. Designs that provide polarization information are also described.

Cost-effective and large-scale fabrication of such structures poses significant challenges on the design process. The objective is to achieve the best performance given the inherent constraints associated with high-volume CMOS fabrication processes.

The disclosed methods and devices address the described challenges and provide practical solutions to the above-mentioned problem.

In particular, the disclosed methods and devices teach various steps to design 3D scattering structures using a scalable fabrication process. Currently, the most scalable fabrication that can handle dimensions smaller than 100 nm is the CMOS foundry fabrication process. In the CMOS process, it is possible to fabricate very complex networks of copper wires stacked on top of each other and embedded in SiO2. FIG. 1B shows an example of such networks, wherein light and dark gray represent metal and SiO2 respectively. However, according to an embodiment of the present disclosure, the wires can be etched away using liquid etchants so that the final 3D scattering structure is composed of voids in SiO2. In accordance with another embodiment of the present disclosure, the 3D scattering structure can be left as voids in SiO2, or the voids can be filled with higher refractive index materials like TiO2 using atomic layer deposition processes.

According to a first aspect of the present disclosure, a method for building a three-dimensional (3D) scattering structure is disclosed, comprising: forming a dielectric structure comprising a first dielectric and a network of metal wires, wherein location, shape and size of the metal wires are selected according to one or more target functions; and etching away the metal wires from the dielectric structure, thus forming a structure containing spaces filled with the first dielectric and voids, wherein location, shape and size of the voids is according to the one or more target functions, wherein the thus formed 3D light scattering structure is configured to receive electromagnetic waves and scatter the electromagnetic waves in accordance with the one or more target functions.

Further aspects of the disclosure are provided in the description, drawings and claims of the present application.

DETAILED DESCRIPTION

Figure 2A:
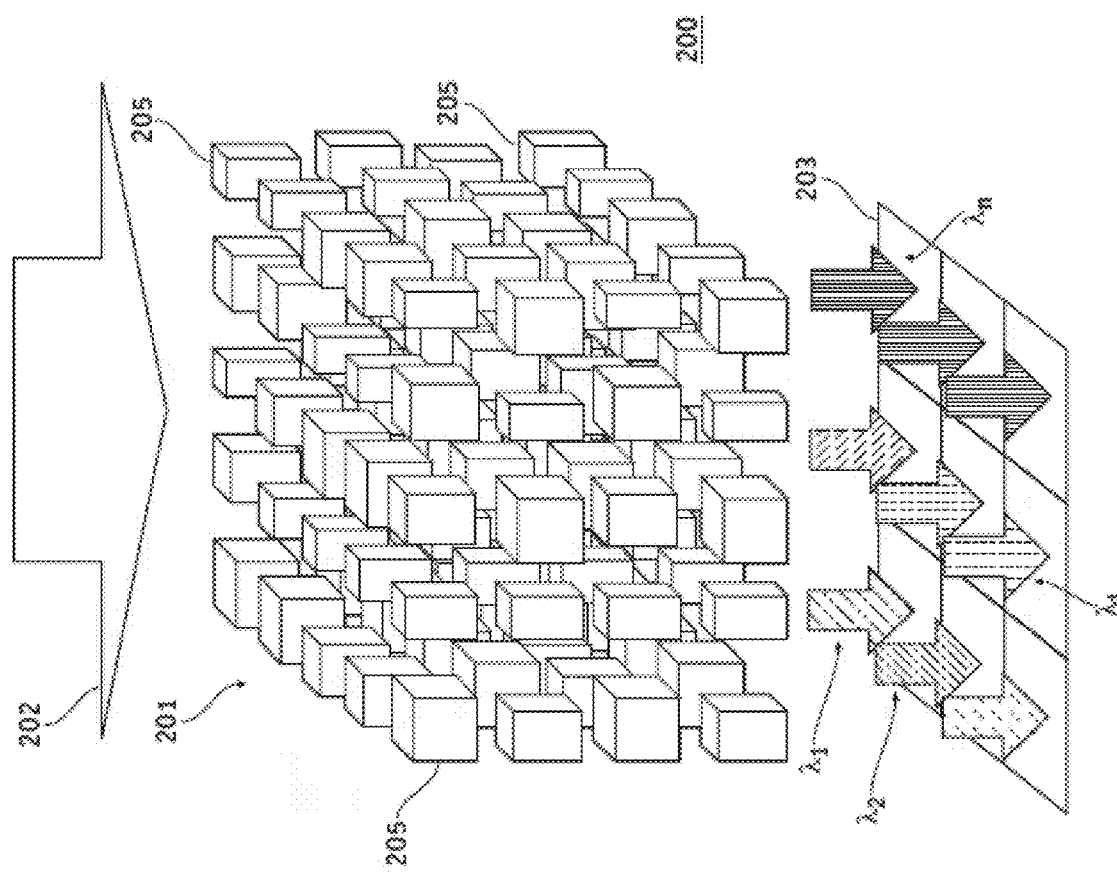
FIGS. 2A-2A' show exemplary three-dimensional (3D) scattering structures according to an embodiment of the present disclosure.
Figure 2A:
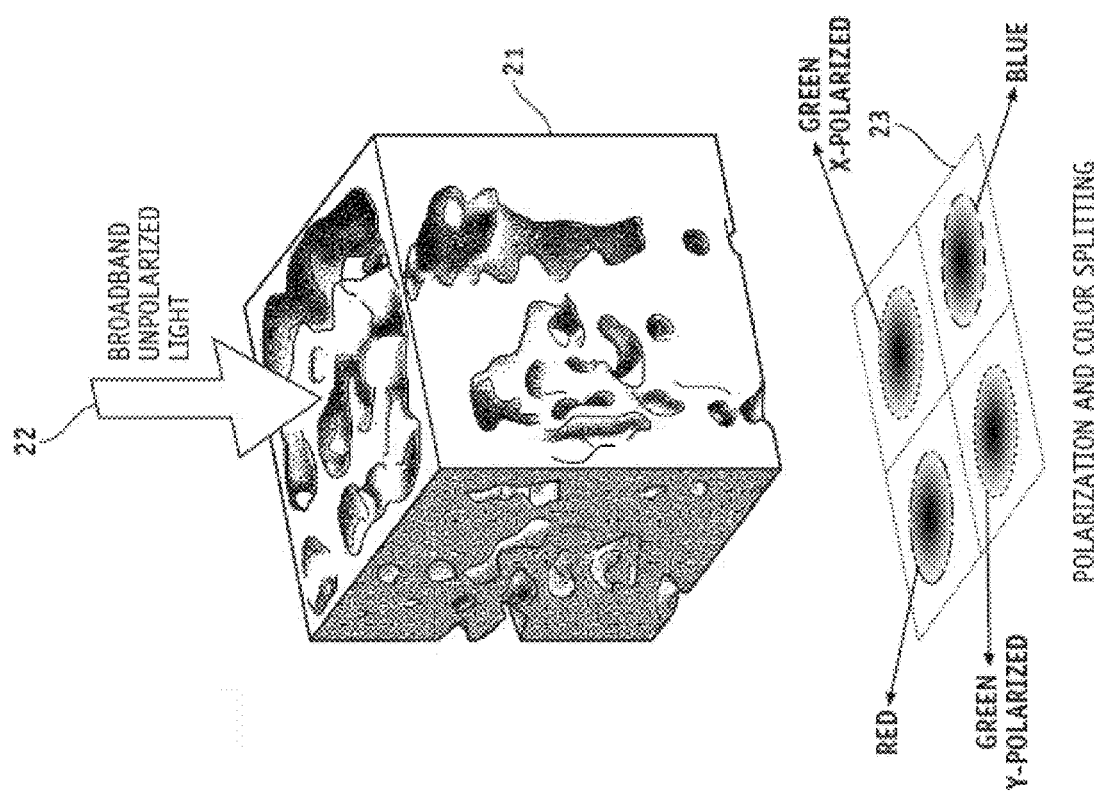

FIG. 2A shows an image sensor (200) according to an embodiment of the present disclosure. The image sensor (200) comprises a three-dimensional (3D) scattering structure (201) functioning as a spectrum splitter. The 3D scattering structure (201) comprises a plurality of dielectric pillars (205) formed to scatter light in a predefined pattern. Incident light (202) passing through the 3D scattering structure (201) is scattered off the dielectric pillars. Through arrangements of the dielectric pillars (205) in accordance with one or more target functions, the scattering pattern is tailored to perform a desired function. As an example, the 3D scattering structure (201) may be designed as a spectrum splitter to simultaneously sort and focus the incident light (202) into an arbitrary number of wavelengths ($\lambda_1, \ldots, \lambda_n$) each directed to an individual pixel on a focal plane (203) placed underneath the 3D scattering structure (201), as shown in FIG. 2A. In accordance with embodiments of the present disclosure, the 3D scattering structure (201) may be a porous polymer cube or a cluster of dielectric or semiconductor (Si for example) particles embedded in a SiO2 matrix. According to further embodiments of the present disclosure, the 3D scattering structure (201) may be a porous polymer cube or a cluster of high-refractive index particles embedded in a low-refractive-index matrix.

Figure 1A:
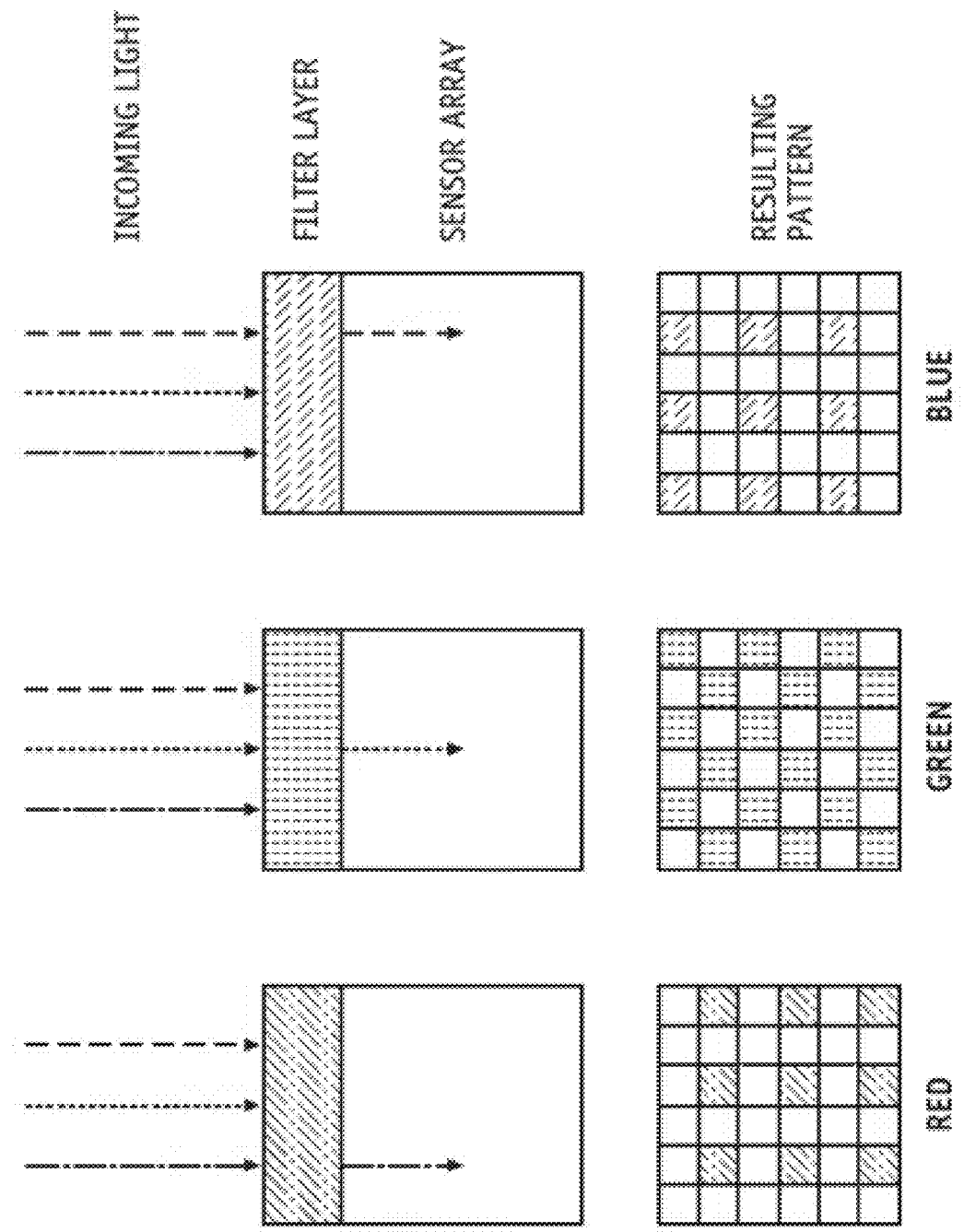
FIG. 1A shows a prior art image sensor.
Figure 1B:
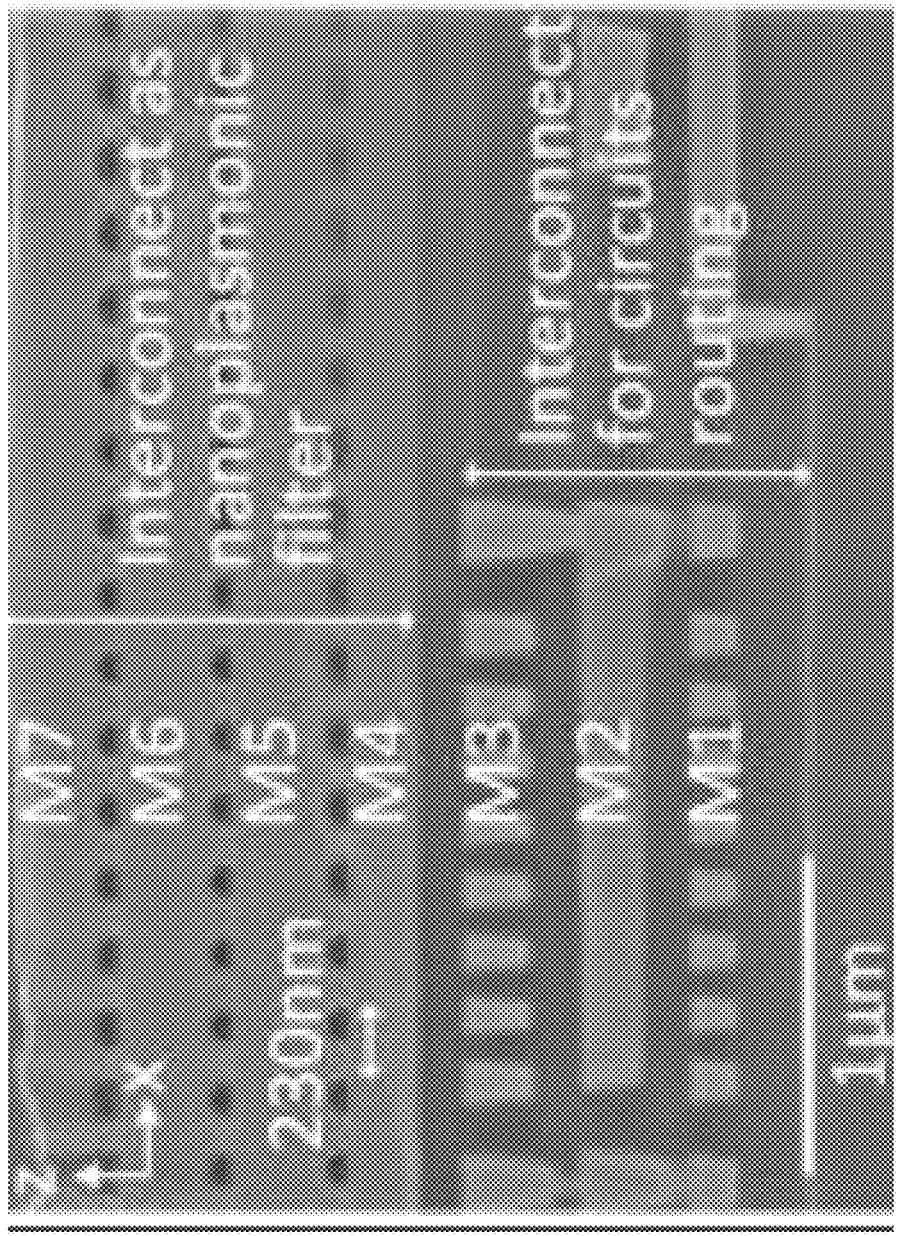
FIG. 1B shows a prior art structure of wires that can be realized using CMOS foundry fabrication techniques, with feature sizes below 100 nm.

The person skilled in the art will appreciate that, in contrast with the prior art image sensor (100) of FIG. 1A, the image sensor (200) of FIG. 2A, does not function based on absorption and as such, it provides a substantial improvement of efficiency compared to existing solutions. This will be quantified later using exemplary embodiments of the present teachings. As also described more in detail throughout the disclosure, the disclosed devices and methods provide the following additional benefits over existing solutions:

- The 3D scattering structure (201) of FIG. 2A may be manufactured through known and scalable lithographic processes.
- The 3D scattering structure (201) of FIG. 2A may be designed to function as a spectrum splitter for arbitrary spectral bands such as infrared, mid-infrared or alike. In other words, in addition to hyperspectral imaging, thermal imaging is another potential application of the disclosed teachings.
- The spectrum splitting function may be combined with other desired functions such as polarization splitting.
- Embodiments according to the present disclosure may also be designed to perform optical image processing such as Gabor filtering for edge detection.

FIG. 2A' shows an image sensor (200') comprising an exemplary three-dimensional (3D) scattering structure (21) functioning as a spectrum filter, according to an embodiment of the present disclosure. Incident light (22) entering from the above is scattered while passing through the 3D scattering structure (21) and sorted in a focal plane (23) consisting of four sub-pixels, shown as red, blue, green (x-polarized) and green (y-polarized). As also shown in FIG. 2A', the red (600 nm-700 nm) and blue (400 nm-500 nm) spectral bands are sorted into opposite quadrants. Moreover, the green (500 nm-600 nm) spectral band is further split according to linear polarization. The red and blue quadrants may be polarization independent.

In accordance with embodiments of the present disclosure, the 3D scattering structure (21) may be designed using an adjoint variable method, which generates a structure that optimizes a specified objective function. As an example, and referring to FIG. 2A', the objective function may be selected based on the focusing efficiency of incident light into one of four target areas depending on the frequency and polarization. Starting with an empty volume, full-wave finite-difference time-domain (FDTD) simulations are implemented to calculate the sensitivity of this figure of merit to perturbations of the refractive index. The prescribed scattering structure is formed and updated iteratively. In other words, the optimal design is generated through iterative updates to an initial geometry, each step improving the performance. The sensitivity may be calculated from just two simulations, allowing efficient optimization of 3D devices with modest resources. The sensitivity for multiple incident wavelengths across the visible spectrum may be calculated, to assign each spectral band to a different quadrant: red (600 nm-700 nm) green (500 nm-600 nm) and blue (400 nm-500 nm). Then a spectrally-averaged sensitivity may be used to update the refractive index of the device.

Figure 2B:
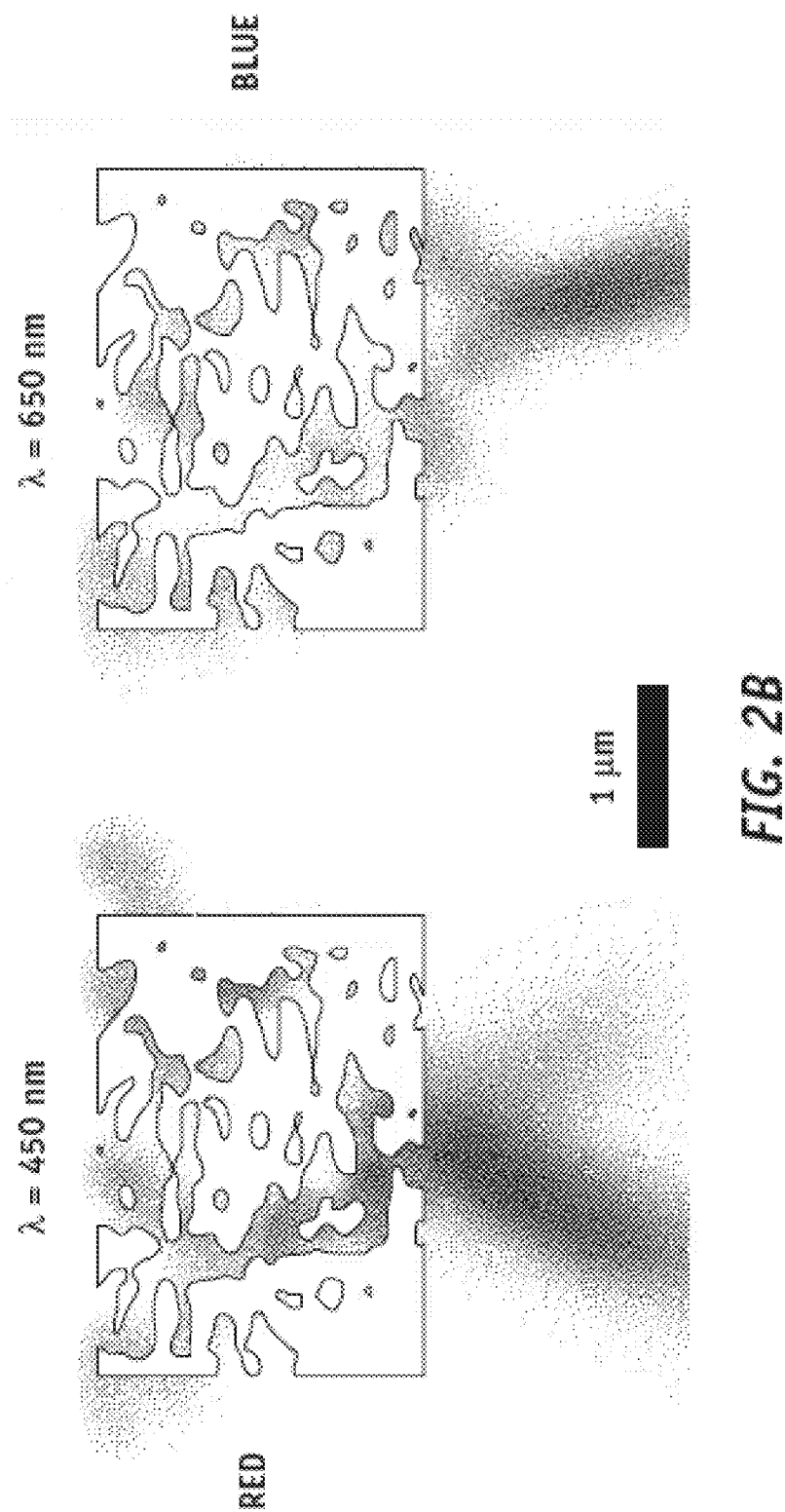
FIGS. 2B-2C show the wavelength splitting functionality of the embodiment of FIGS. 2A and 2A'.
Figure 2C:
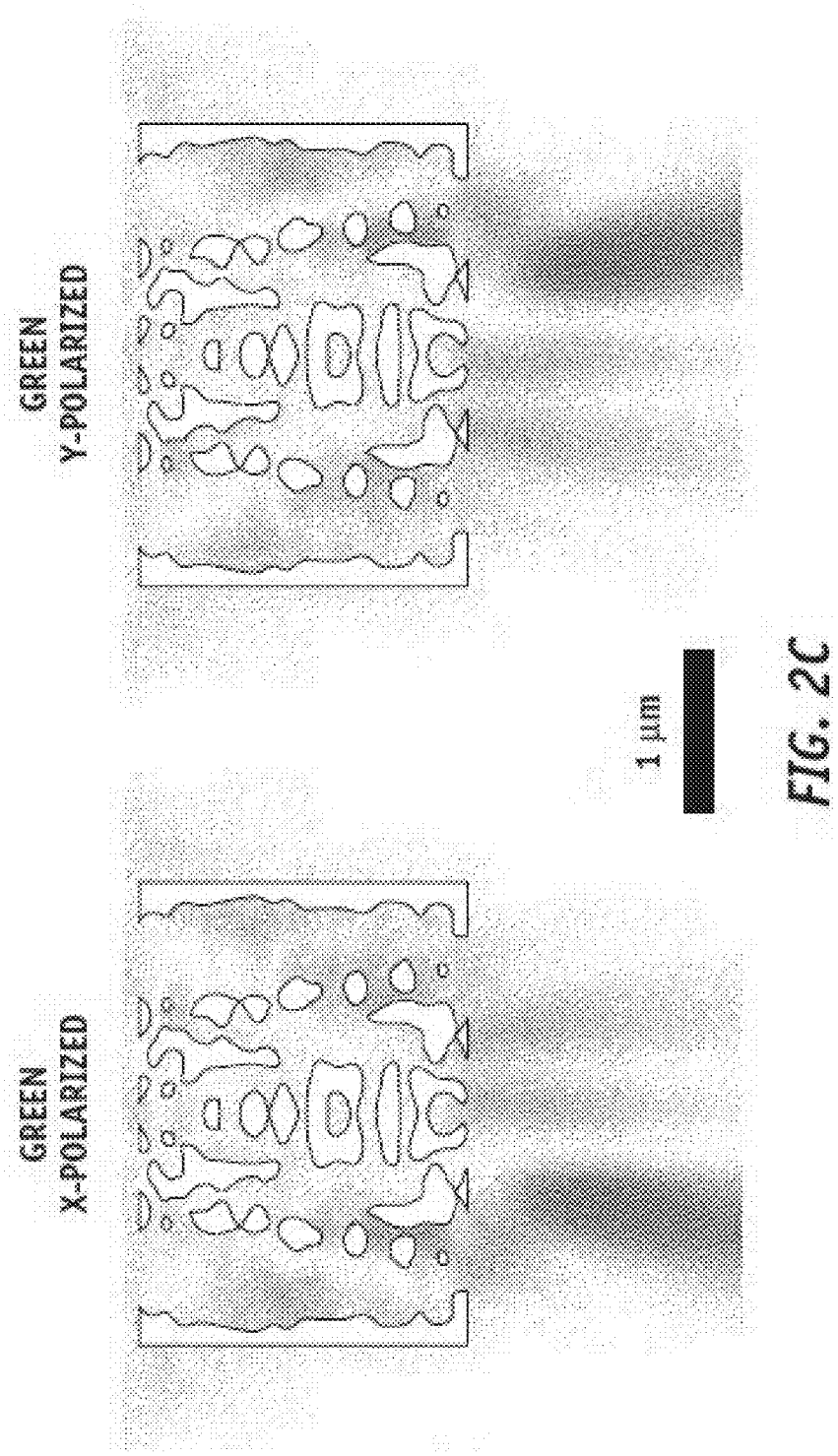

FIGS. 2B-2C show the simulated intensity of the incident light within the 3D scattering structure (21) of FIG. 2A'. The intensity is analyzed along a diagonal cross section that intersects the red and blue quadrants of FIG. 2A'. Each wavelength undergoes multiple scattering before focusing to its respective target region. FIG. 2C shows the intensity distribution of incident light within a diagonal cross-section through the green pixels for two orthogonal input polarizations. In both cases, a plane wave ($\lambda=550$ nm) incident from above is preferentially routed to the pixel corresponding to its polarization. Meanwhile, both polarizations are assigned the same region for red and blue spectral bands, maintaining the mirror symmetry of the objective function.

In accordance with an embodiment of the present disclosure, the 3D scattering structure (21) of FIG. 2A' sorts red, green, and blue light with 84%, 60% and 87% efficiency respectively. Throughout the present disclosure, the efficiency is defined as the fraction of the total power incident on the device that reaches the target quadrant averaging across the spectrum for which the device is designed for, i.e. the visible spectrum for the embodiment of FIG. 2A'.

With reference to FIGS. 2A, and 2A', the person skilled in the art will appreciate that the disclosed concept provides substantial flexibility in defining the target scattering function, with independent control for any incident polarization, angle, or frequency. However, complex three-dimensional structures present a significant challenge for fabrication. Large-scale implementation of these devices in image sensors at visible wavelengths will require high fabrication throughput with sub-100-nm resolution. This may be achieved by multi-layer lithography, where three-dimensional devices are constructed through repeated material deposition and patterning. Here, each layer consists of a series of patterned mesas composed of a high-index dielectric. The interstitial space is filled with a low-index dielectric, forming a flat surface that serves as a substrate for subsequent layers.

Figure 3A:
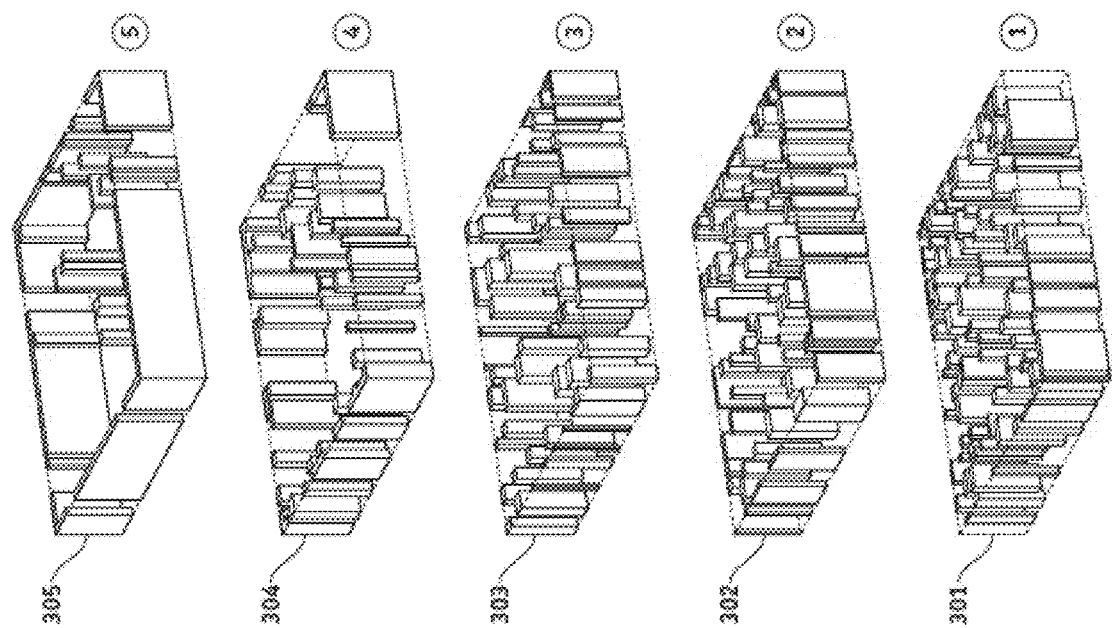
FIGS. 3A-3C show an exemplary three-dimensional (3D) scattering structure according to another embodiment of the present disclosure.
Figure 3B:
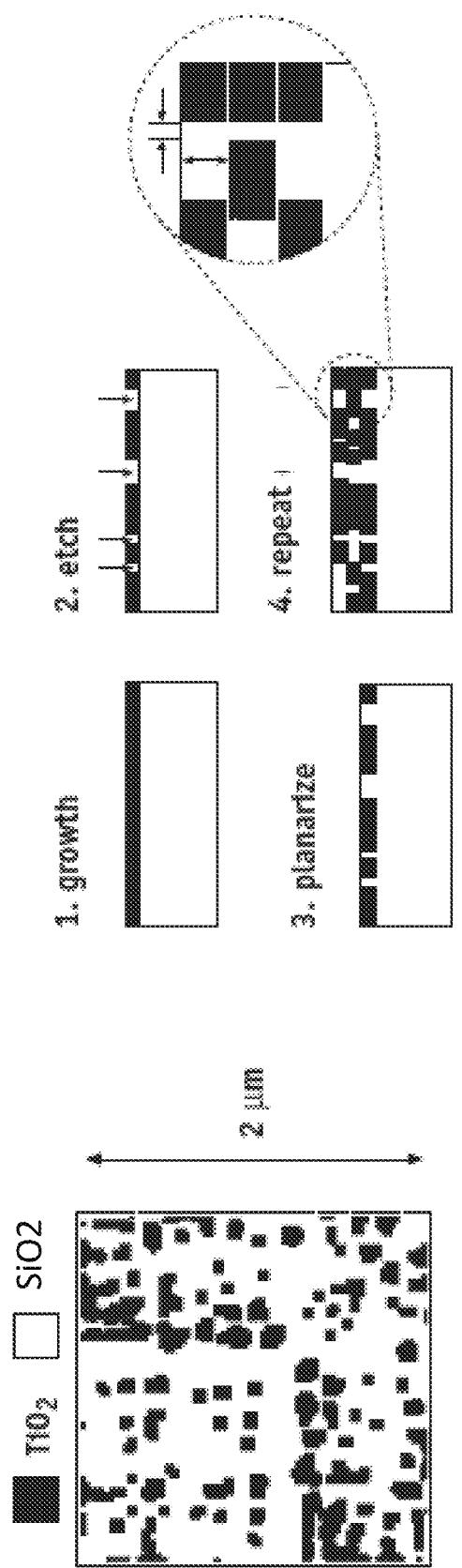
Figure 3C:
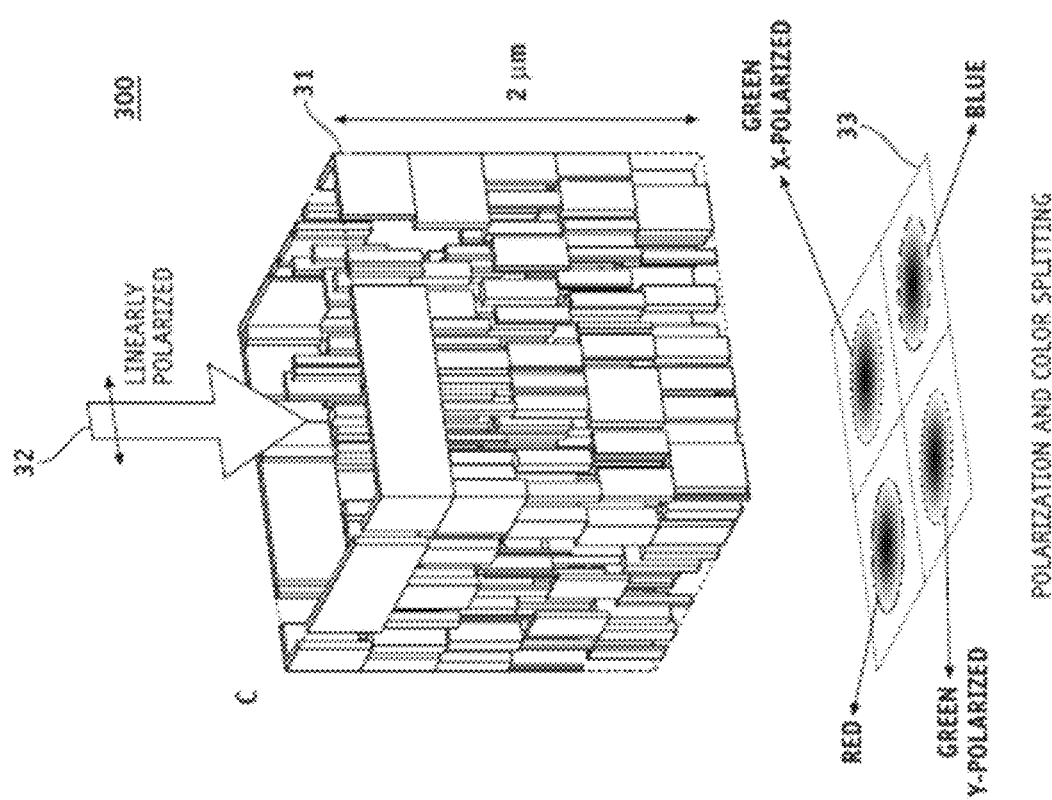

In order to further clarify the layered manufacturing approach discussed above, reference is made to FIGS. 3A and 3C illustrating a layered design of a 3D scattering structure (31) of FIG. 3C. In other words, the 3D scattering structure (31) of FIG. 3C may be structured by stacking the plural layers (301, . . . , 305) of FIG. 3A on top of one another. The fabrication process may be CMOS-compatible wherein the fabrication constraints may be directly incorporated with the design algorithm. Each layer (301, . . . , 305) may be produced using lithography. The 3D scattering structure (31) may be composed of TiO2 and SiO2, materials that are transparent at visible frequencies. The layers (301, . . . , 305) may be 2 um×2 um layers, each 400 nm tall. The person skilled in the art will understand that these are exemplary dimensions for description purposes, and that embodiments in accordance with the present disclosure, and with dimensions and numbers of layers other than those mentioned above may also be envisaged. As shown in FIG. 3B, each layer may comprise a set of irregular TiO2 mesas surrounded by SiO2. With reference to FIG. 3B', the lithography process may begin by growing a thin layer of dielectric (e.g. TiO2) on top of a substrate (e.g. SiO2). A pattern is transferred onto this layer by lithography and the unprotected material is etched away to produce a two-dimensional dielectric structure. Finally, the surface is coated (deposition) with low-refractive index dielectric and mechanically polished (planarization). By repeating the same process for each layer and stacking up layers the desired 3D structure is produced. Such a lithography process provides flexibility in material design, and is compatible with industry-standard CMOS fabrication process, as noted above.

Optimization Algorithms
Gradient Descent

Referring back to FIGS. 2A'-3C, and as mentioned previously, three-dimensional dielectric structures, optimized to perform a target optical scattering function are designed according to the teachings of the disclosure. In the case of the exemplary embodiments shown in FIGS. 2A'-3C, such target scattering function consists of focusing incident plane waves to different positions depending on the frequency and polarization. The exemplary three-dimensional (3D) scattering structures (21, 31) are defined by a spatially-dependent refractive index distribution $n(\vec{x})$ within a cubic design region. This represents an expansive design space with the capacity to express a broad range of complex optical multi-functionality. However, identifying the optimal index distribution for a given target function remains a challenging inverse design problem, particularly for strongly scattering devices.

Figure 3D:
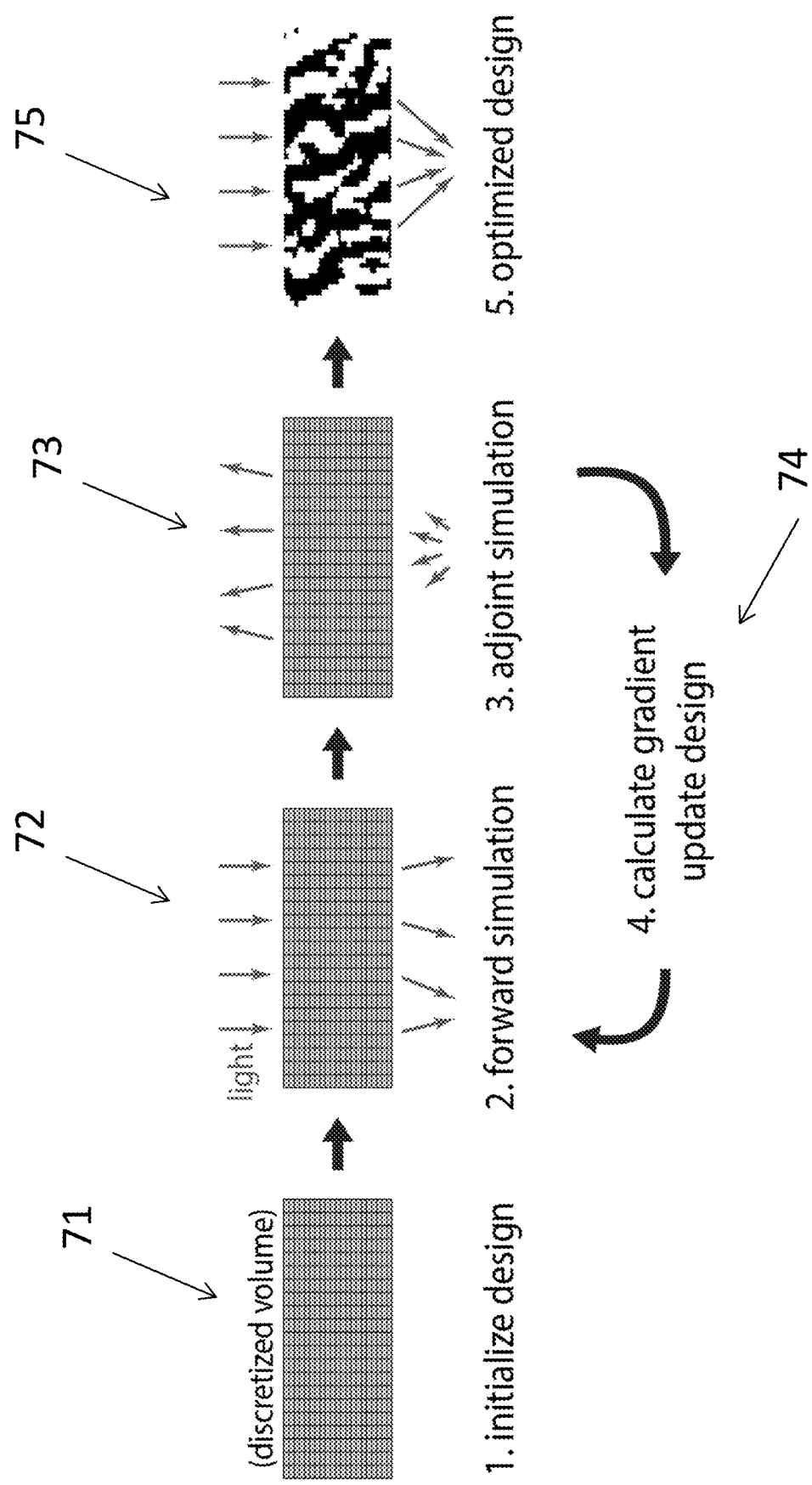
FIG. 3D shows multiple steps of an exemplary optimization algorithm in accordance with an embodiment of the present disclosure.

In order to overcome such a challenge, and according to the teachings of the present disclosure, an iterative approach guided by gradient descent may be implemented, wherein starting from an initial index distribution, full-wave simulations (FDTD) is used to calculate the sensitivity of the focusing efficiency with respect to perturbations of the refractive index. The sensitivity may be calculated from just two simulations, allowing efficient optimization of three-dimensional devices with modest resources. Based on the sensitivity, the initial design is modified in order to maximize the performance while conforming to fabrication constraints. This update process is repeated until the optimized device can efficiently perform the target function In order to further clarify what is described above, reference is made to FIG. 3D showing multiple steps of a gradient based optimization algorithm in accordance with an embodiment of the present disclosure. The algorithm is initialized, step (81), with a uniform refractive index distribution, $$n_0(\vec{x}) = \frac{n_{max} + n_{min}}{2},$$

wherein $n_{max}$ and $n_{min}$ represent the maximum and minimum values of the refractive index respectively. This distribution is continually updated to maximize the electromagnetic intensity at the target location in focal plane, $f(n(\vec{x}))=|\vec{E}(\vec{x}_0)|^2$. This objective function serves as a proxy for focusing efficiency while simplifying the sensitivity calculation. The sensitivity, $$\frac{df}{dn}(\vec{x}),$$

is computed, step 74, from the electromagnetic fields in two FDTD simulations (forward and adjoint), steps (72, 73), according to the following expression:

$$\frac{df}{dn}(\vec{x}) = 2n(\vec{x})\mathrm{Re}\{\vec{E}_{fwd} \cdot \vec{E}_{adj}\} \quad (1)$$

where $\vec{E}_{fwd}$ are the electric fields within the cube when illuminated from above with a plane wave, step (72), and $\vec{E}_{adj}$ are the electric fields within the cube when illuminated from below, step (73) with a point source at the target location. The phase and amplitude of the point source are given by the electric field at the target location in the forward simulation. The sensitivity may be calculated for multiple incident wavelengths and polarizations across the visible spectrum, assigning each spectral band to a different quadrant: red (600 nm-700 nm) green (500 nm-600 nm) and blue (400 nm-500 nm). The spectrally-averaged sensitivity is then used to update the refractive index of the device, step (74), using the following formula:

$$n_{i+1}(\vec{x}) = n_i(\vec{x}) + \alpha \sum_\lambda \frac{df_\lambda}{dn}(\vec{x}) \quad (2)$$

The step size α may be fixed at a small fraction (e.g., α=0.001) to ensure that the change in refractive index can be treated as a perturbation in the linear regime. The sensitivity is recalculated after each update. After several iterations, the algorithm converges to the optimized design, step (75), wherein the resulting structure focuses incident light with the desired efficiency.

Figure 4A:
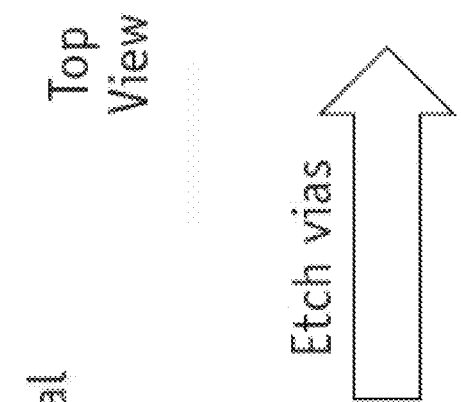
FIG. 4A shows an exemplary 3D structure made of dielectric and comprising wire networks in accordance with an embodiment of the present disclosure.
Figure 4A:
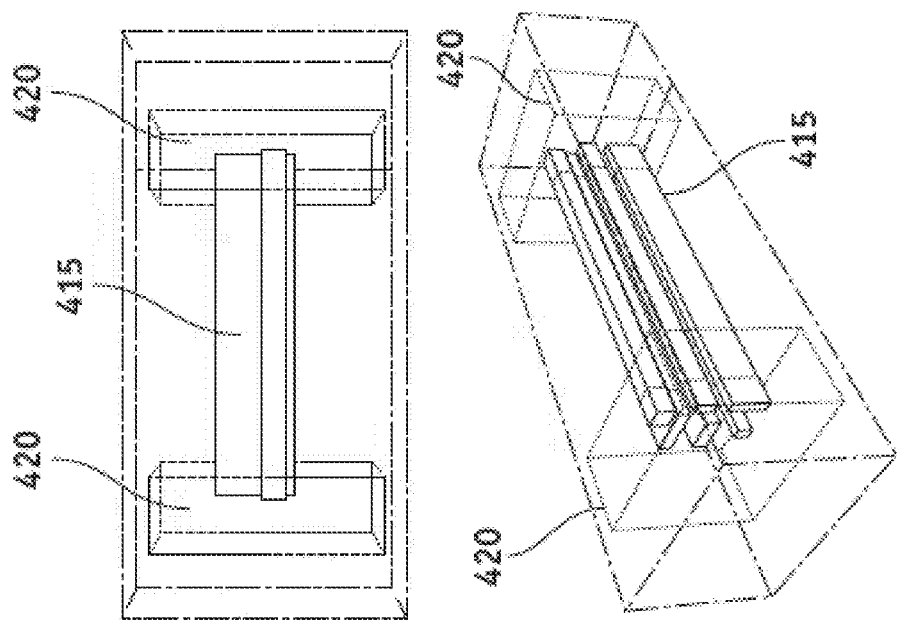
Figure 4A:
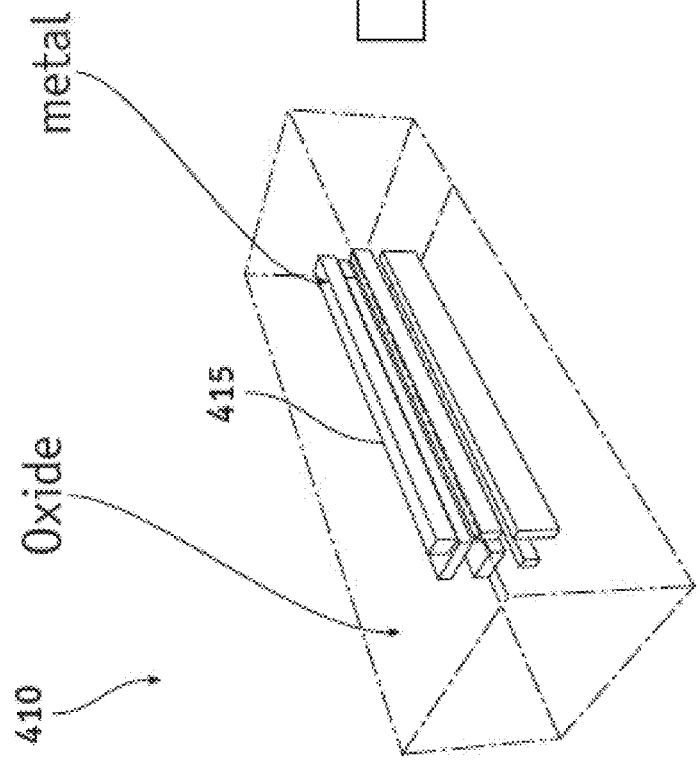
Figure 4B:
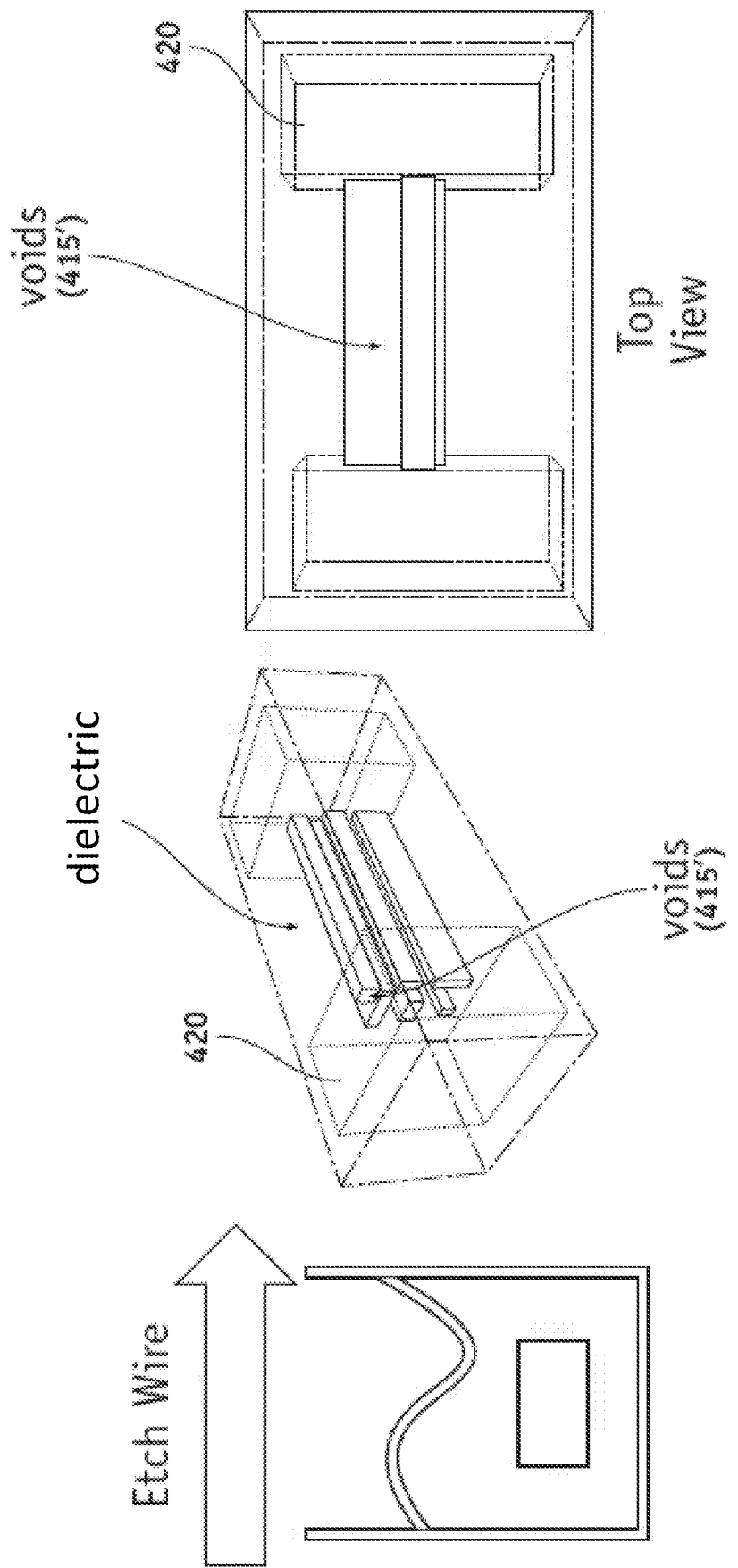
FIG. 4B shows an exemplary process of etching away the wire network within a 3D structure, in accordance with a further embodiment of the present disclosure.

FIG. 4A shows a 3D scattering structure (410) made of a dielectric, the 3D structure (410) comprising a wire network (415) embedded inside the scattering structure (410). The dielectric may be made of an oxide such as SiO2 and the wire network (415) may be made of metal, e.g. copper. As mentioned previously, in order to produce complex 3D scattering elements performing a target function, voids may be formed within the 3D structure (410) by etching away the wire network (415) initially fabricated within the 3D scattering structure (410). In order to do this, making now reference to FIGS. 4A-4B, and according to further embodiments of the present disclosure, vias (420) are etched in the dielectric to access ends of wires in the wire network (405) and then etching the wires away using a liquid etchant, in order to obtain voids (415').

Throughout the disclosure, the term "wire pitch" will be referred to the minimum spacing two neighboring wires of a wire network within a 3D structure can be from each other. Also, there is a minimum wire feature size imposed by limitations of the fabrication process. Therefore, when forming voids within the 3D structure by etching out wires, the minimum wire pitch sets the minimum dielectric feature size and the minimum wire size sets the minimum void/air feature size. In what follows, exemplary steps of the methods in accordance with the teaching of the present disclosure to design the 3D scattering structure (410) while respecting manufacturing process constraints are described.

Free, Continuous Optimization

In what follows, 3D structures made of a dielectric wherein voids are formed in accordance with a target function will be described. The process may start with a free optimization, as described in the previous sections with regards to FIGS. 2A-3D, where the index of refraction is allowed to change continuously between air (n=1.0) and a low index material, SiO2 (n=1.5). As an example, a gradient descent algorithm may be used where the sensitivity of an objective function to changes in the index is calculated at all points in the design region. With reference to the example of FIGS. 2A' and 3C, the objective function to be optimized may be selected as an electric field intensity at different focal points for different wavelength bands. Such an objective function may be used when a wavelength splitter is being designed. The design obtained by the free and continuous optimization may not be in-line with requirements imposed by constraints due to manufacturing. Throughout this document, the term "free optimization" refers to optimization methods wherein no fabrication constraints are imposed and the term "continuous optimization" refers to optimization methods wherein a specific fabrication constraint is lifted. As an example, in such optimization methods, the refractive index can take any value within a set range, not just the extremes. As detailed in the following paragraphs, the disclosed methods address this issue by implementing a binarization of the refractive index followed by further optimization of the design using, for example, a gradient descent approach, while respecting the manufacturing requirements.

Two Dimensional (2D) Shape Representation and Binarization

Throughout this document, the term "binarization" refers to a fabrication constraint wherein only a handful of materials can be selected, so no continuous index distribution is allowed. As an example, the CMOS technology imposes such a fabrication constraint. Considering the example of a 2D shape, an explicit representation of such a shape may be a series of points in a 2D plane that define the boundary of such shape. In case of a rectangle, the shape can be defined by just four points in the plane. Another way of representing either specific shapes like rectangles or arbitrary shapes is to use an implicit representation. Throughout this document, the term "level set function" is referred to a function that is an implicit representation of a geometry. For example, in the case of a 2D shape, a level set function may be defined as a function ƒ(x, y), or in other words a surface in three dimensions. The contour defined by f(x, y)=constant (e.g., the constant is equal to 0) defines the boundary of the shape in two dimensions.

As will be detailed later, in accordance with embodiments of the present disclosure, level set functions representing features with geometric shapes such as rectangle instead of free form shapes as allowed by the free, continuous optimization algorithm may be envisaged. As described later, this approach will allow an optimized design while tight requirements imposed by the manufacturing process are met. The gradient information from the continuous optimization method can then be mapped to perturbations of the level set function such that the boundary of the shape moves in a way to improve the design. When simplifying to features with, for example, rectangular shape (or some other parameterizable shape), this boundary perturbation can be converted to a perturbation of the feature parameters, e.g., in the case of a rectangle, a center point and two widths. In what follows, the example of features with rectangular shapes will be used to describe the teachings of the disclosure, keeping in mind that features with shapes other than rectangular may also be envisaged.

Level Set Representation

Figure 5:
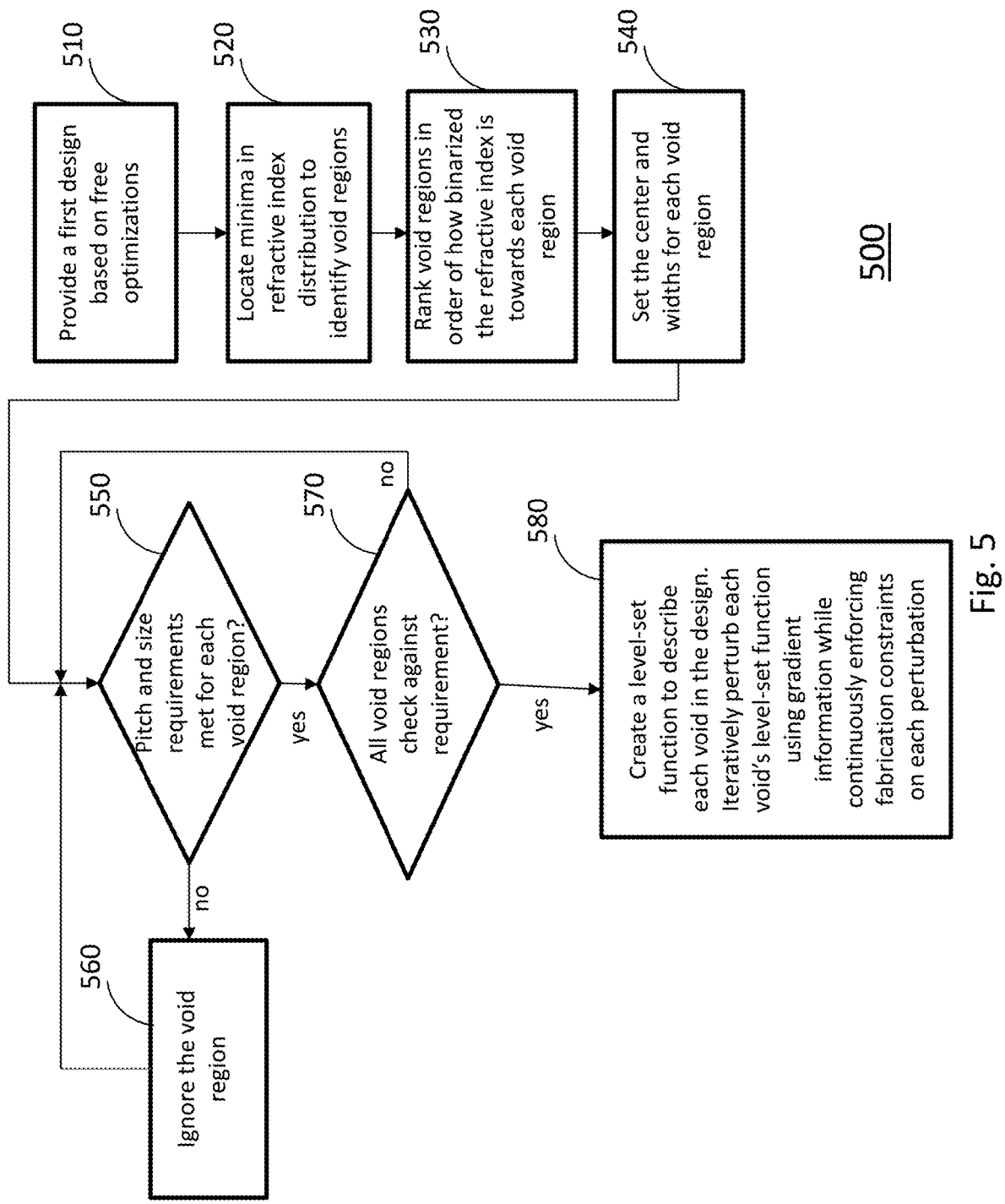
FIG. 5 shows an exemplary flowchart illustrating various steps of designing a 3D scattering structure in accordance with the teachings of the present disclosure.

According to embodiments of the present disclosure, the design of 3D structures mentioned previously is implemented in 2D while enforcing a layering in the direction of propagation of the input source. In other words, making for example reference to rectangular features, the position and the width of the features are the parameters that are controlled. FIG. 5 shows a flowchart (500) describing various steps of the design process, in accordance with embodiments of the present disclosure. As can be seen in the flowchart (500), first an initial optimized design based on free/continuous optimization is provided (step 510). This design will essentially provide the refractive index distribution along horizontal directions in each layer and no manufacturing constraint is imposed when generating such initial design. Then for each layer, the following steps are taken:

1. A procedure is run to identify peaks in the void index distribution (step 520). The minima found in this way represent void regions that may not necessarily be completely void according to the free/continuous optimization as previously described. In other words, some regions may represent local minima.

2. The identified regions are then ranked based on how close they are to being a void (step 530). This is performed using the outcome of the design based on the free/continuous optimization algorithm as described previously. In other words, void features are prioritized to be placed where they seem to be most desired by the free design.

Figure 6:
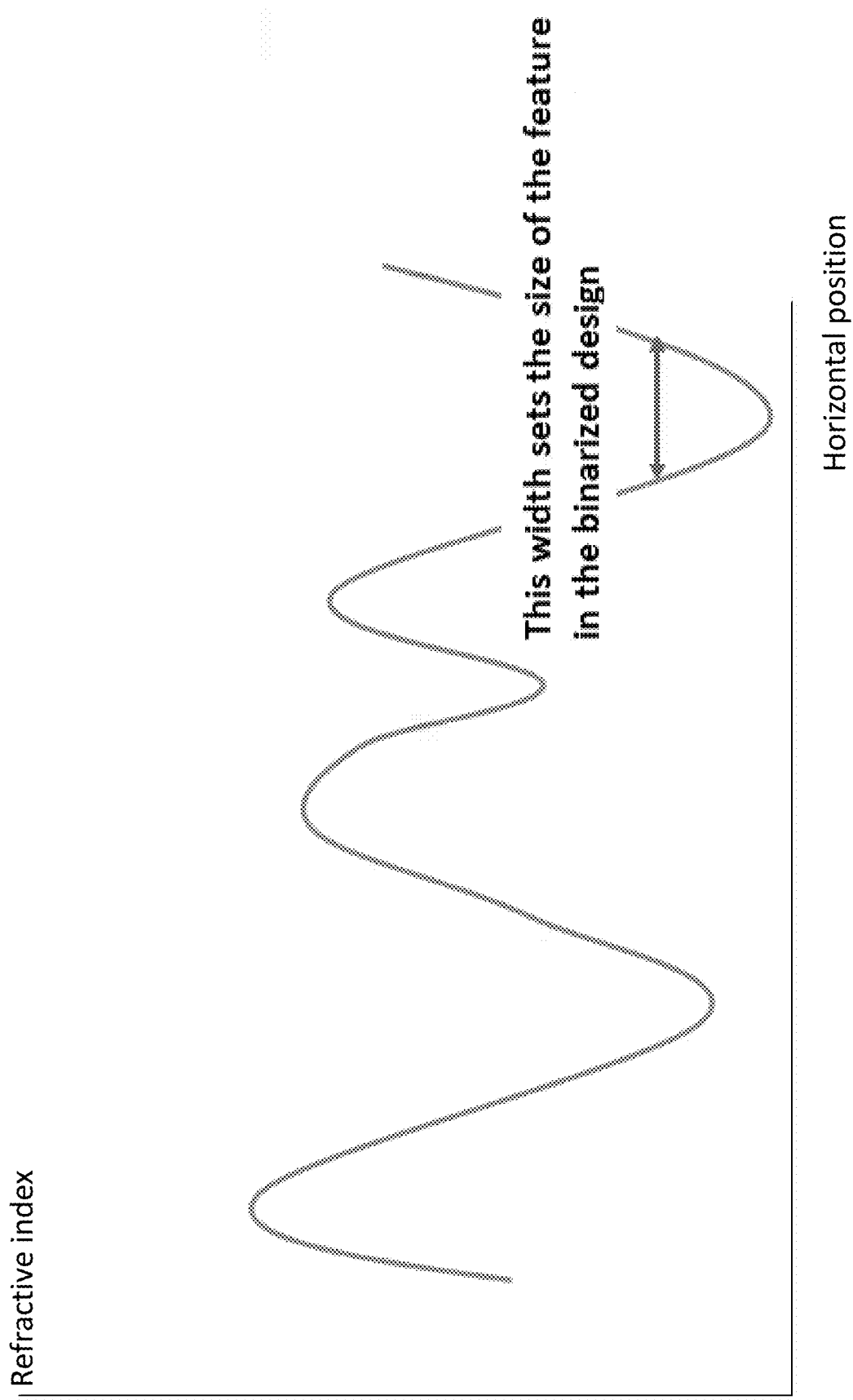
FIG. 6 shows an exemplary graph illustrating the refractive index distribution along horizontal position.

3. Proceeding from the highest to the lowest ranked void features, each void is replaced with a rectangle that approximates the original index distribution (step 540). The dimensions of the rectangle are chosen to maintain the same volume-averaged refractive index as the original distribution, providing a binary-index replacement. This is illustrated in FIG. 6 wherein an exemplary graph representing the index distribution vs. the horizontal position is shown.

4. The manufacturing (e.g. CMOS process) constraints are required to be met by each feature (steps 550-570). In other words, the width of each feature is required to meet the minimum width requirement, which is set, as mentioned before, by the minimum wire size that is manufacturable. The distances between centers of adjacent features are required to meet the manufacturing pitch requirement. Any feature not meeting any of such requirements may be ignored.

5. Using the center/width of each feature as found in the previous steps, a level set function is created and assigned to each feature (step 580). As described later, the created level functions will be updated (step 580) to improve the performance of the binarized design.

Performance Improvement of the Binarized Design

As mentioned previously, according to embodiments of the present disclosure, and in order to meet manufacturing constraints, the 3D structures may be designed based on specific shapes such as rectangular bars. As typical from designs using free/continuous optimization, such designs already provide improved overall performance compared to existing solutions. However, designing based on freeform shapes may still result in a better overall performance compared to those based on more specific features. In accordance with the teachings of the disclosure, and starting from a binarized device, the gradient information can be used to iteratively update the design to further improve the overall performance. As illustrated by flowchart (500) of FIG. 5, step (580), the gradient information from the free/continuous optimization method can be mapped to perturbations of the width/center of all rectangular features used in the binarized design (step 580 of FIG. 5). In other words, the gradient of the objective function with respect to the index distribution can be mapped to a perturbation of the boundaries via the Hamilton-Jacobi equation. This means we can update the boundary (here widths) using the same information that is used to optimize the continuous graded-index structure. The inventors have noticed that, when adopting such an approach, and after several iterations, significant improvement over the already good performance of the binarized design will be obtained, while respecting at the same time the constraints imposed by the manufacturing process (e.g. CMOS process). In what follows, the performance of the described design approach will be described using exemplary embodiments of the disclosure.

Figure 7A:
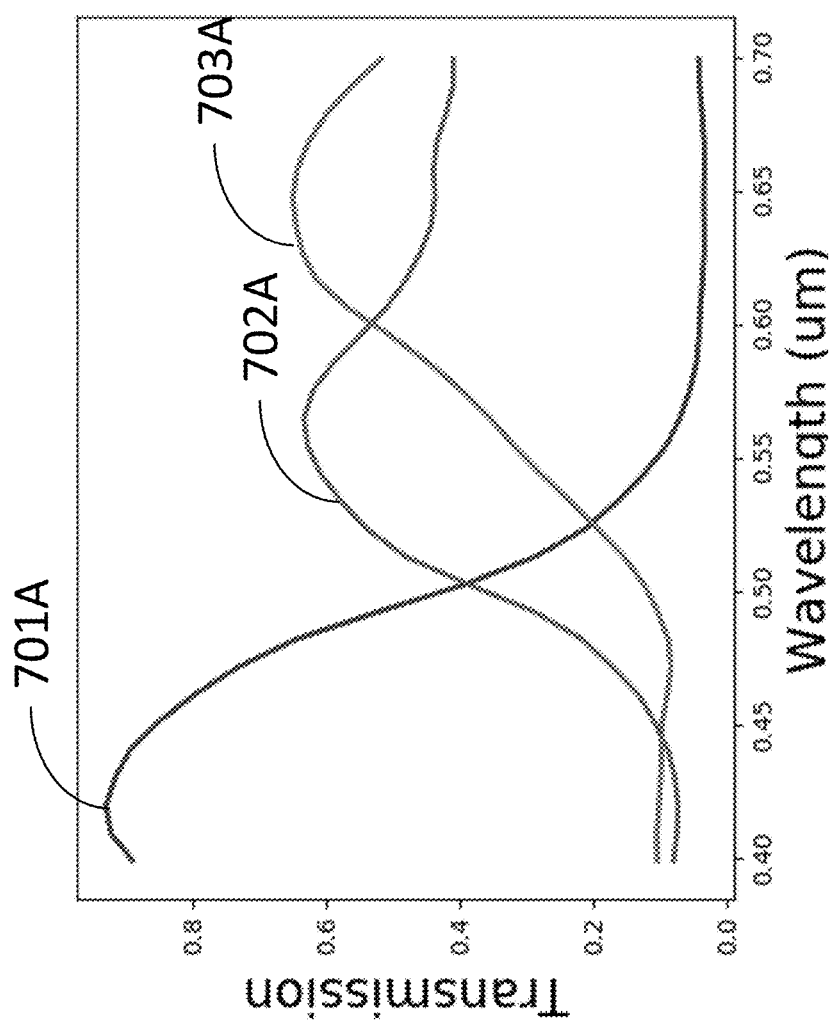
FIGS. 7A-7C show graphs representing the performance of a 3D scattering structure implemented in accordance with the teachings of the present disclosure.
Figure 7B:
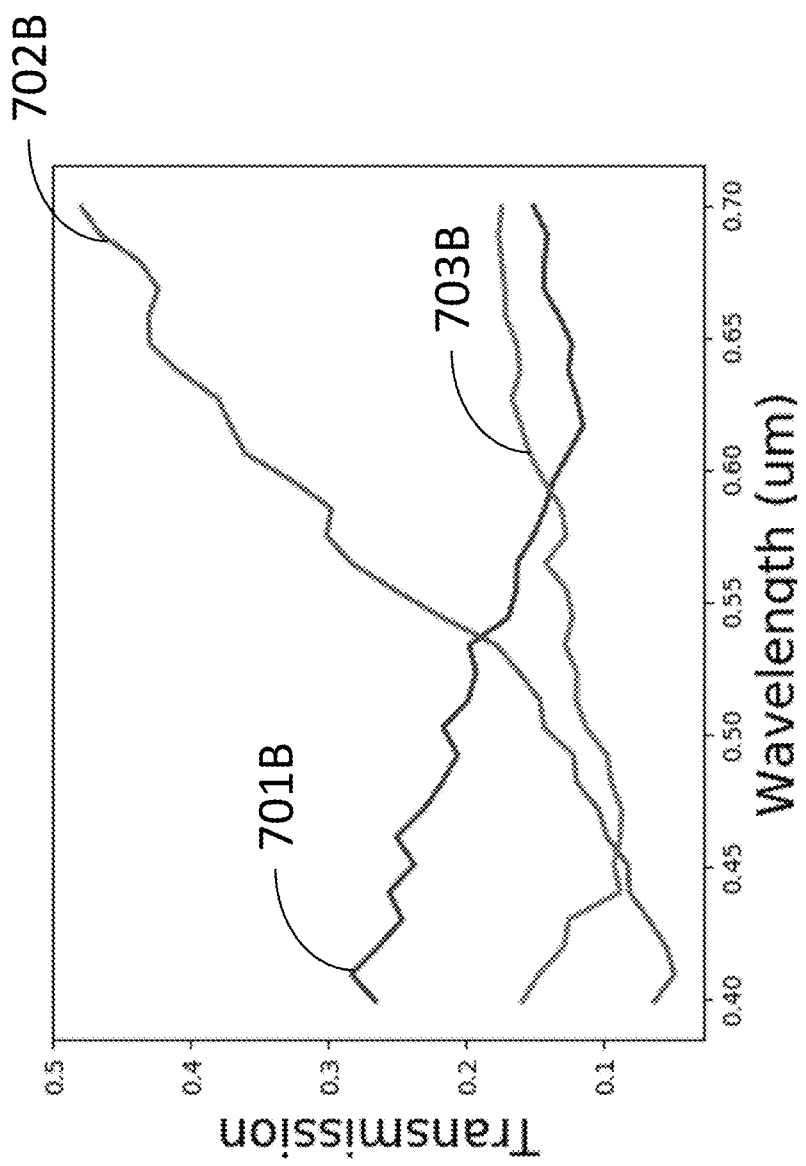
Figure 7C:
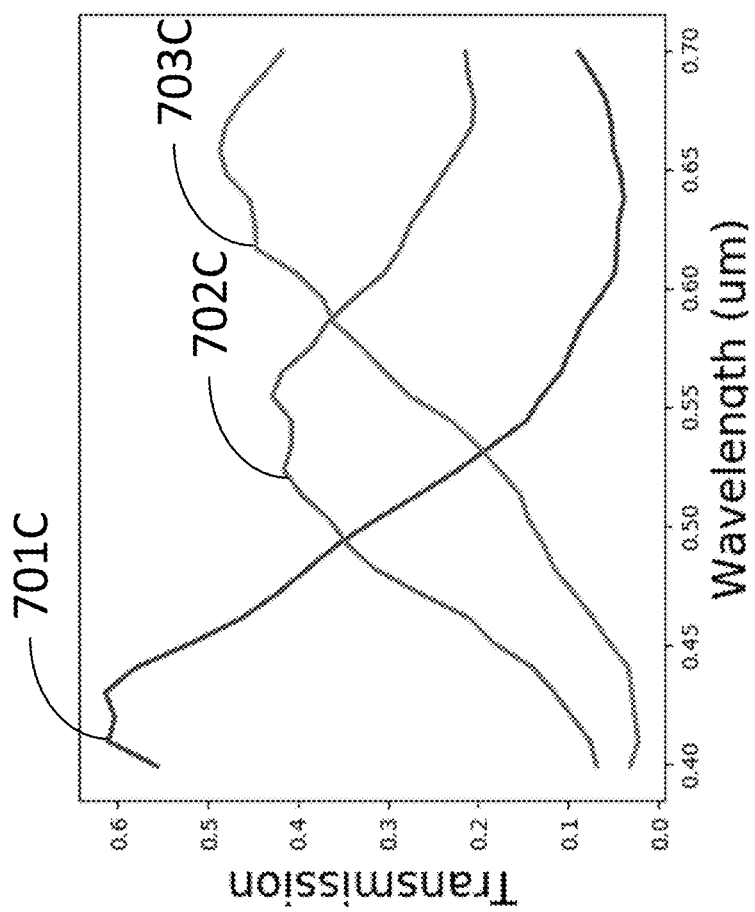

FIGS. 7A-7C show performance results related to an exemplary 3D scattering structure optimized for single polarization and 3 color focus (e.g. red, green and blue). The 3D structure is made of SiCOH (n=1.3) wherein air gaps (n=1) are formed using the methods described previously. A 2D approach as described before was used using 8 layers (450 nm/layer). FIG. 7A shows the transmission spectra related to the design based on free/continuous optimization.

Graphs (701A, 702A, 703A) represent plots of transmission as a function of wavelength for colors (blue, green, red) respectively. FIG. 7B shows the transmission spectra related to the binarized design. Graphs (701B, 702B, 703B) represent plots of transmission as a function of wavelength for different focal regions. A degradation of the performance compared to the results obtained in the case of free optimization is noticed. FIG. 7C shows the transmission spectra obtained after further optimizing the binarized design after the gradient information from the free/continuous optimization method is mapped to perturbations of the width/center of all of the rectangular features used in the binarized design. Graphs (701C, 702C, 703C) represent plots of transmission as a function of wavelength for colors (blue, green, red) respectively. A significant improvement over the performance of the binarized design can be noticed.

What is claimed is:

1. A method for building a three-dimensional (3D) scattering structure, comprising:
    forming a dielectric structure comprising a first dielectric and a network of metal wires, wherein location, shape and size of the metal wires are selected according to one or more target functions; and
    etching away the metal wires from the dielectric structure, thus forming a structure containing spaces filled with the first dielectric and voids, wherein location, shape and size of the voids is according to the one or more target functions,
    wherein the thus formed 3D light scattering structure is configured to receive electromagnetic waves and scatter the electromagnetic waves in accordance with the one or more target functions.

2. The method of claim 1, further comprising filling the voids with a second dielectric different from the first dielectric, thus obtaining a 3D light scattering structure made of two different dielectrics.

3. The method of claim 1, wherein the etching is performed by generating vias in the 3D scattering structure.

4. The method of claim 1, wherein the forming is performed through a CMOS process.

5. The method of claim 2, wherein the first and the second dielectric materials comprise SiCOH and $TiO_2$ respectively.

6. The method of claim 1, wherein the forming is performed using stacked layers.

7. The method of claim 6, wherein the location and size of the voids are provided using an optimization method based on gradient descent.

8. The method of claim 7, wherein the voids within each layer have geometric shapes each represented by one or more parameters.

9. The method of claim 8, wherein each geometric shape is a rectangle and the one or more parameters comprise a center and two widths along horizontal directions.

10. The method of claim 9, wherein the optimization method comprises providing an initial 3D pattern using a continuous optimization algorithm to generate a refractive index distribution along horizontal directions within each layer.

11. The method of claim 10, wherein the optimization method further comprises:
    for each layer:
        identifying minima of the refractive index distribution to provide the location of voids; based on the continuous optimization algorithm, ranking voids to indicate how binarized each void is;

proceeding from a highest ranked to a lowest ranked void, setting the two widths and the center for each void;

checking each void against a set size and a set pitch requirement to provide a set of acceptable voids; and perturbing the two widths of voids of the set of acceptable voids based on the continuous optimization algorithm to further optimize and improve overall performance of the 3D scattering structure.

12. The method of claim 11, wherein the set size and pitch requirements are related to CMOS manufacturing constraints.

13. An image sensor built based on the method of claim 1.

* * * * *